(12) United States Patent
Wang

(10) Patent No.: US 7,847,374 B1
(45) Date of Patent: Dec. 7, 2010

(54) NON-VOLATILE MEMORY CELL ARRAY AND LOGIC

(76) Inventor: Chih-Hsin Wang, 7115 Wooded Lake Dr., San Jose, CA (US) 95120

(*) Notice: Subject to any disclaimer, the term of this patent is extended or adjusted under 35 U.S.C. 154(b) by 42 days.

(21) Appl. No.: 12/168,448

(22) Filed: Jul. 7, 2008

Related U.S. Application Data

(60) Provisional application No. 60/956,079, filed on Aug. 15, 2007, provisional application No. 60/948,405, filed on Jul. 6, 2007.

(51) Int. Cl.
*H01L 29/73* (2006.01)
(52) U.S. Cl. .......... 257/560; 257/564; 257/E21.61; 257/E21.613
(58) Field of Classification Search .......... 257/555, 257/565–566, E27.004, E45.002, 272, 561, 257/563–564, E21.61, E21.613
See application file for complete search history.

(56) References Cited

U.S. PATENT DOCUMENTS

| | | | |
|---|---|---|---|
| 5,397,912 A * | 3/1995 | Sundaram | 257/518 |
| 5,841,175 A * | 11/1998 | Sugiura et al. | 257/392 |
| 5,858,831 A * | 1/1999 | Sung | 438/241 |
| 6,294,817 B1 * | 9/2001 | Srinivasan et al. | 257/397 |
| 6,348,709 B1 * | 2/2002 | Graettinger et al. | 257/311 |
| 2003/0030084 A1 * | 2/2003 | Moise et al. | 257/295 |
| 2006/0049392 A1 * | 3/2006 | Pellizzer et al. | 257/5 |

* cited by examiner

*Primary Examiner*—A. Sefer
*Assistant Examiner*—Allen L Parker

(57) ABSTRACT

A semiconductor device comprising a memory region including one or more transistor string arrays, a logic region including one or more logic transistors and an isolation region for isolating the logic transistors. The string array includes a plurality, T, of bipolar junction transistors. The string array includes a common collector region for the T bipolar junction transistors, a common base region for the T bipolar junction transistors, a plurality of emitters, one emitter for each of the T bipolar junction transistors, a number, B, of base contacts for the T bipolar junction transistors where the base contacts electrically couple the common base region and where the number of base contacts, B, is less than the number of transistors, T.

41 Claims, 30 Drawing Sheets

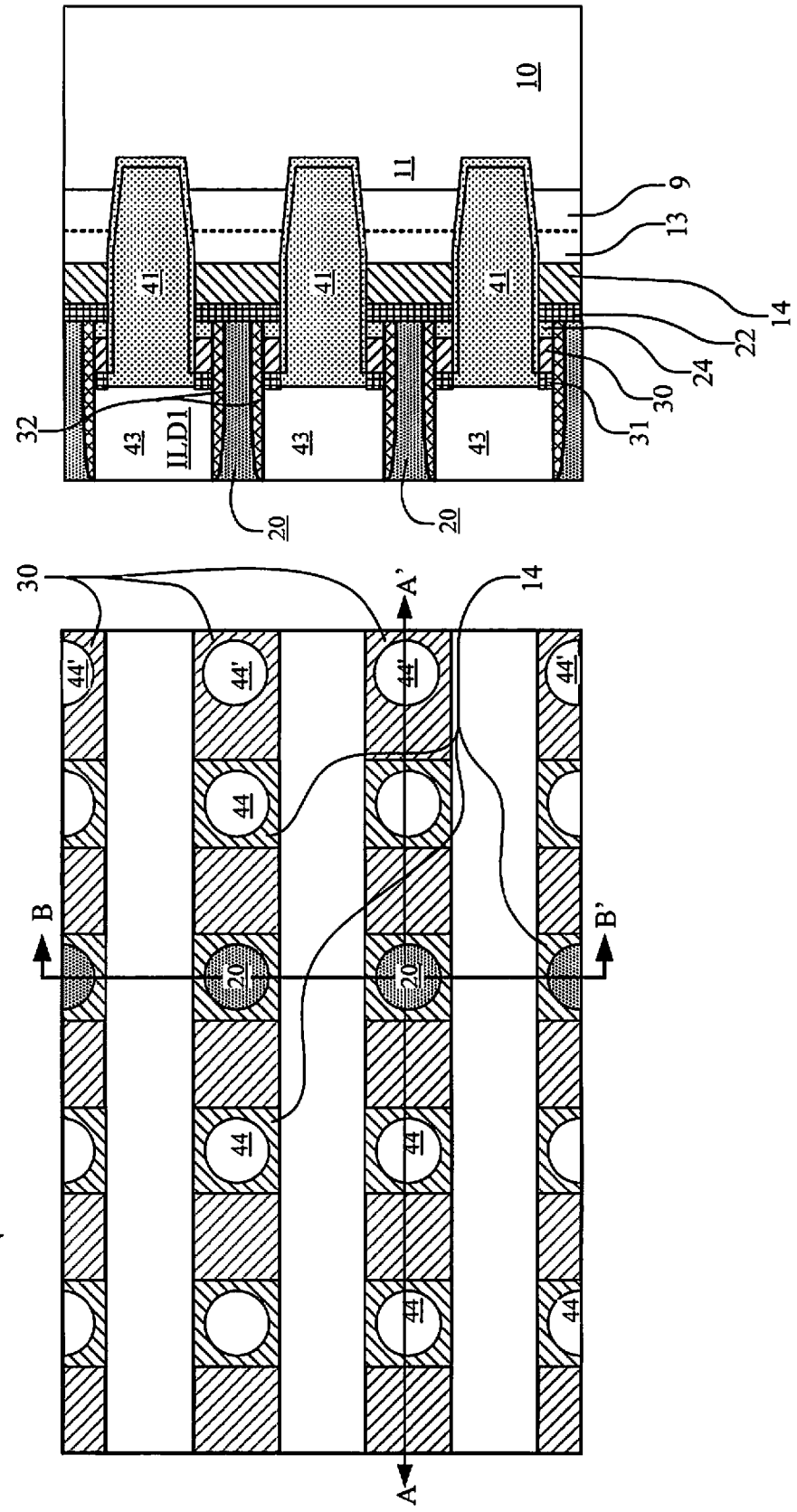

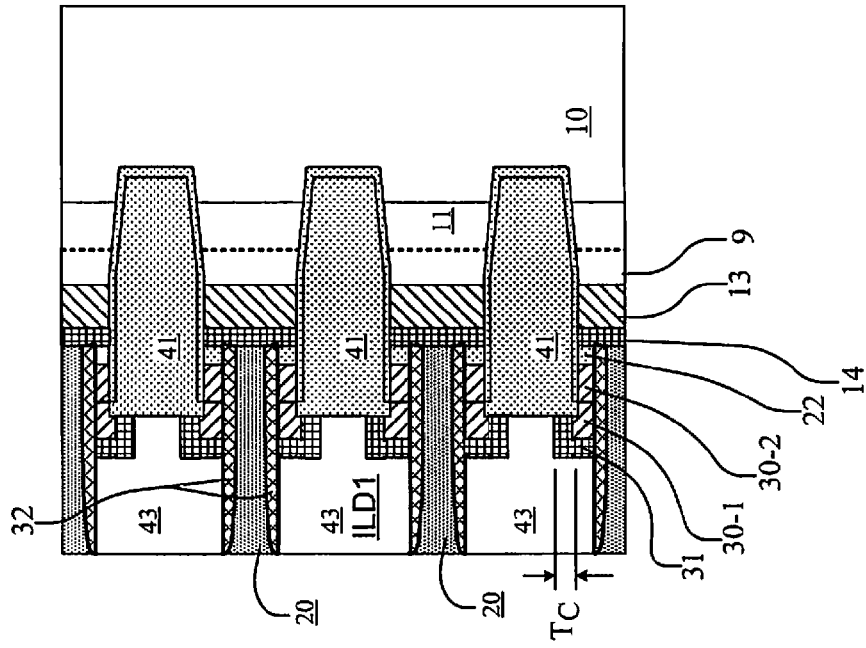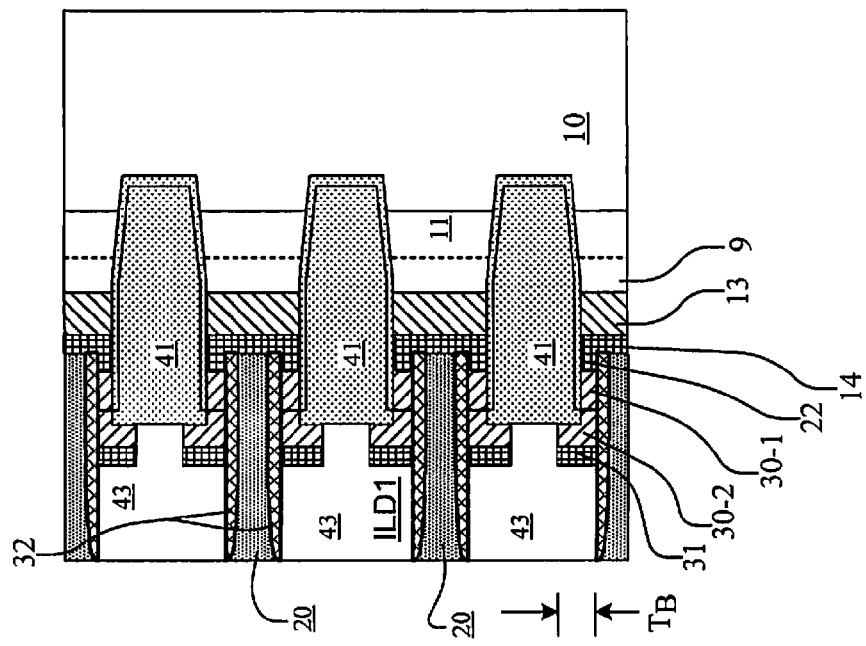

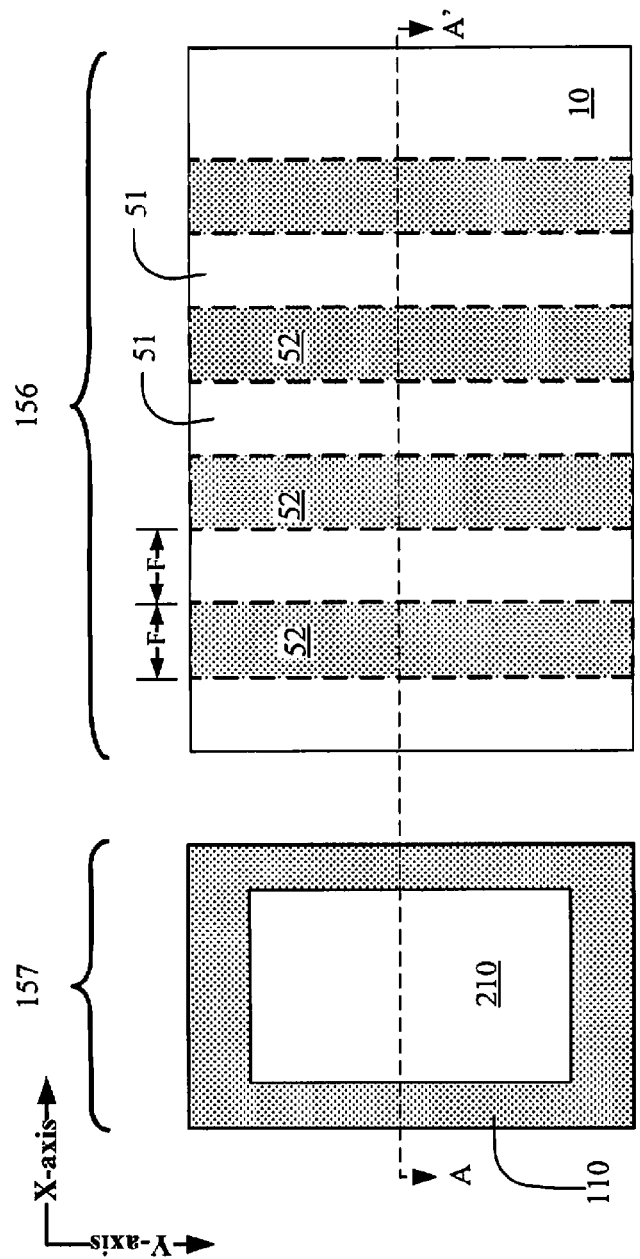
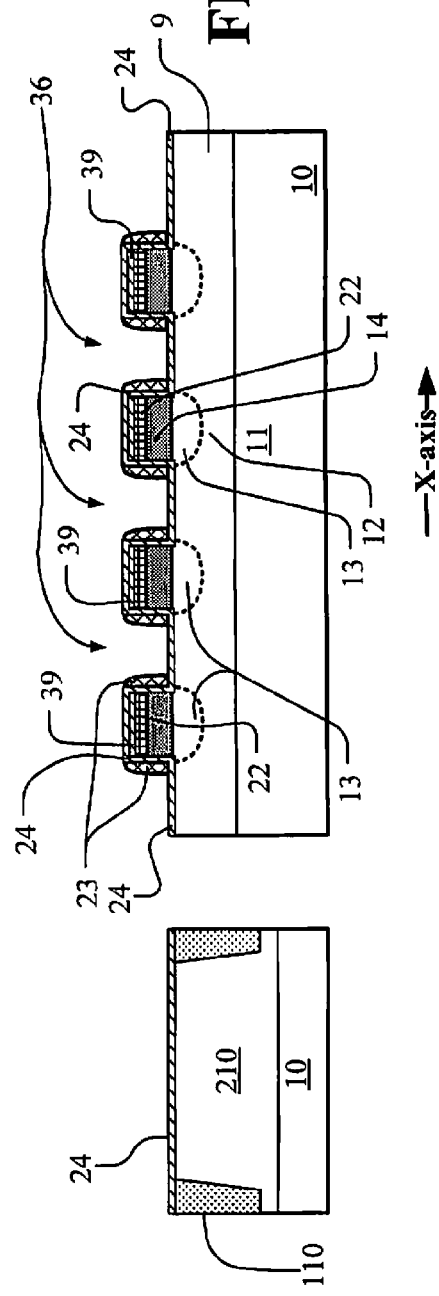
FIG. 6
FIG. 6A

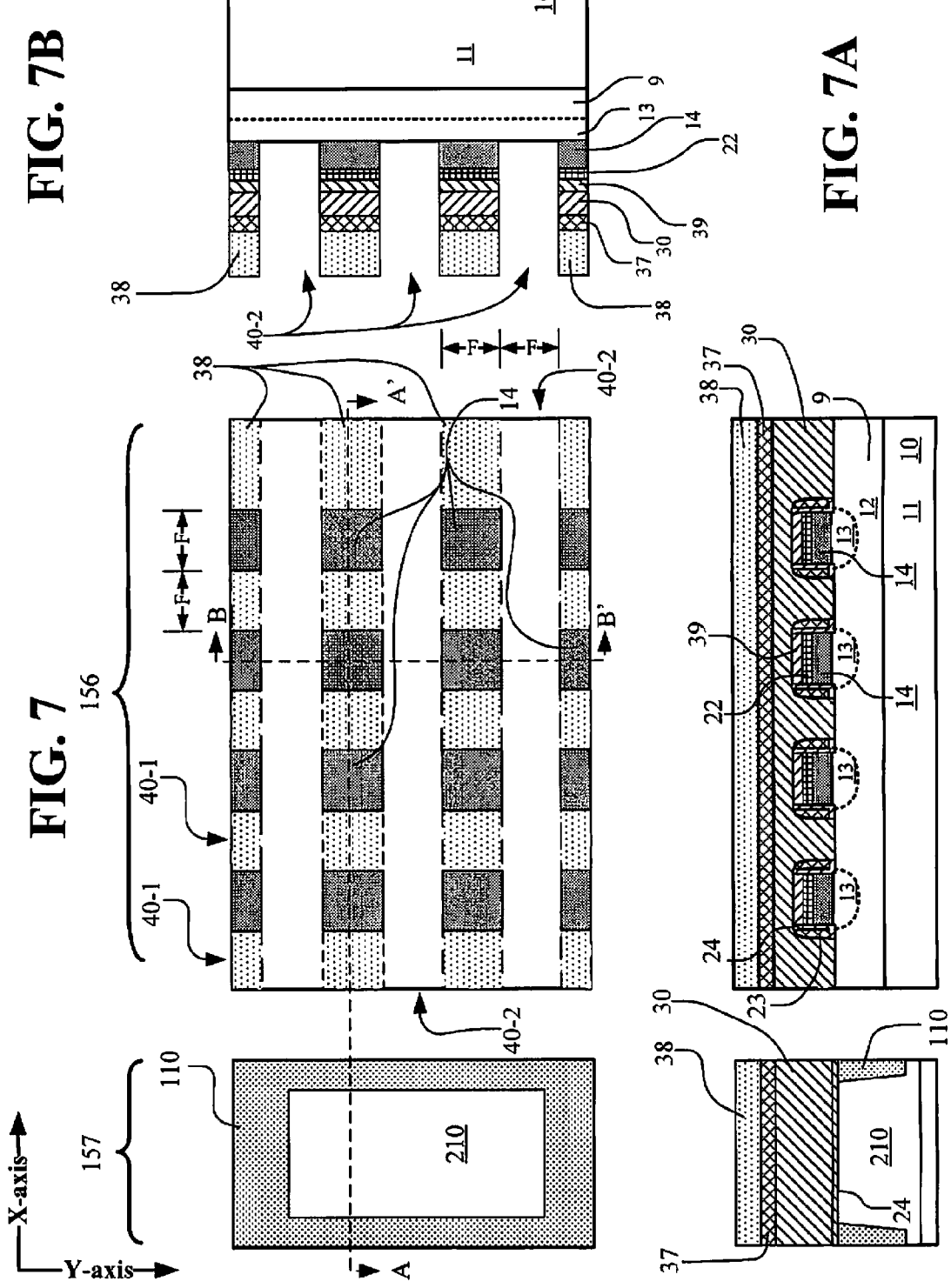

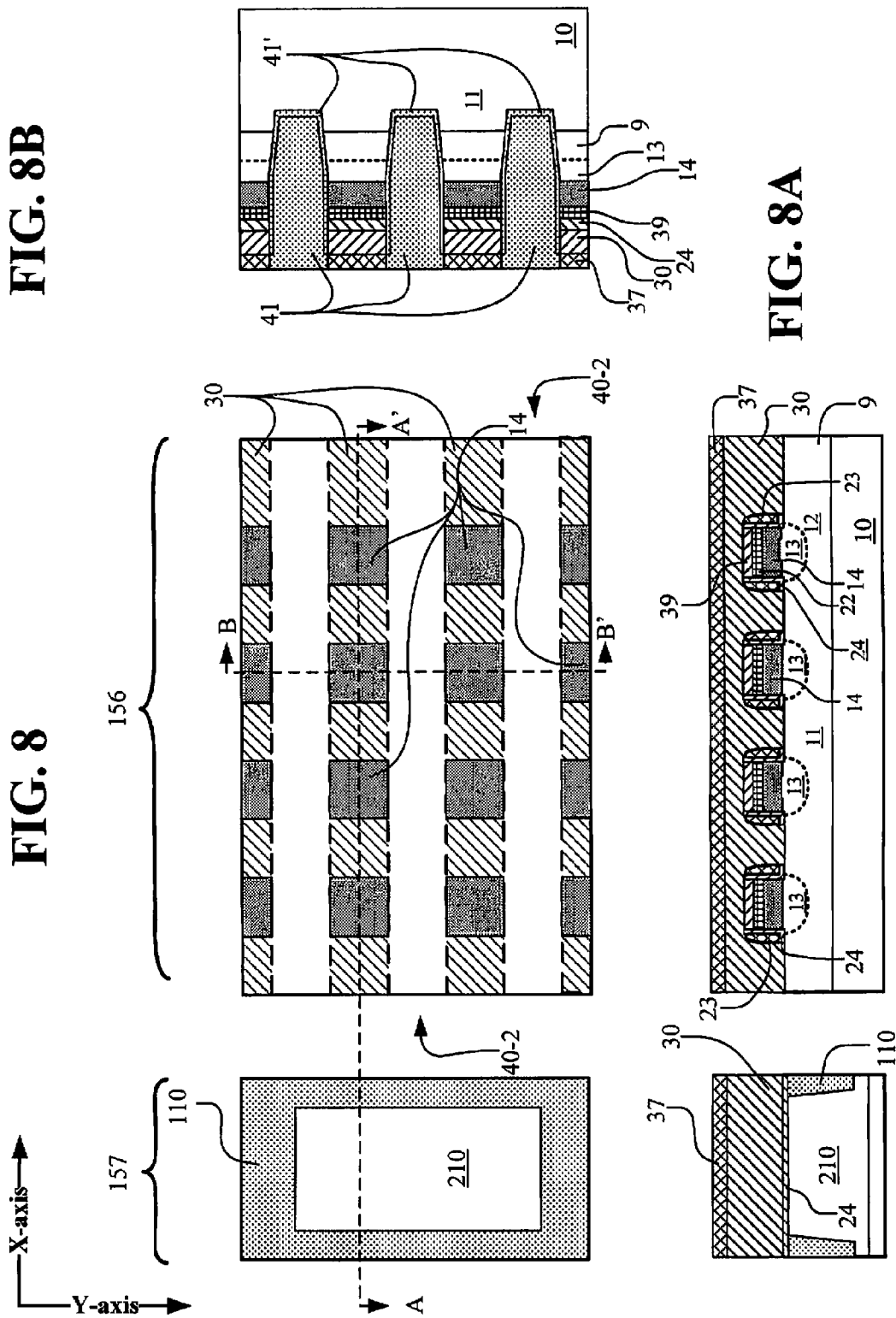

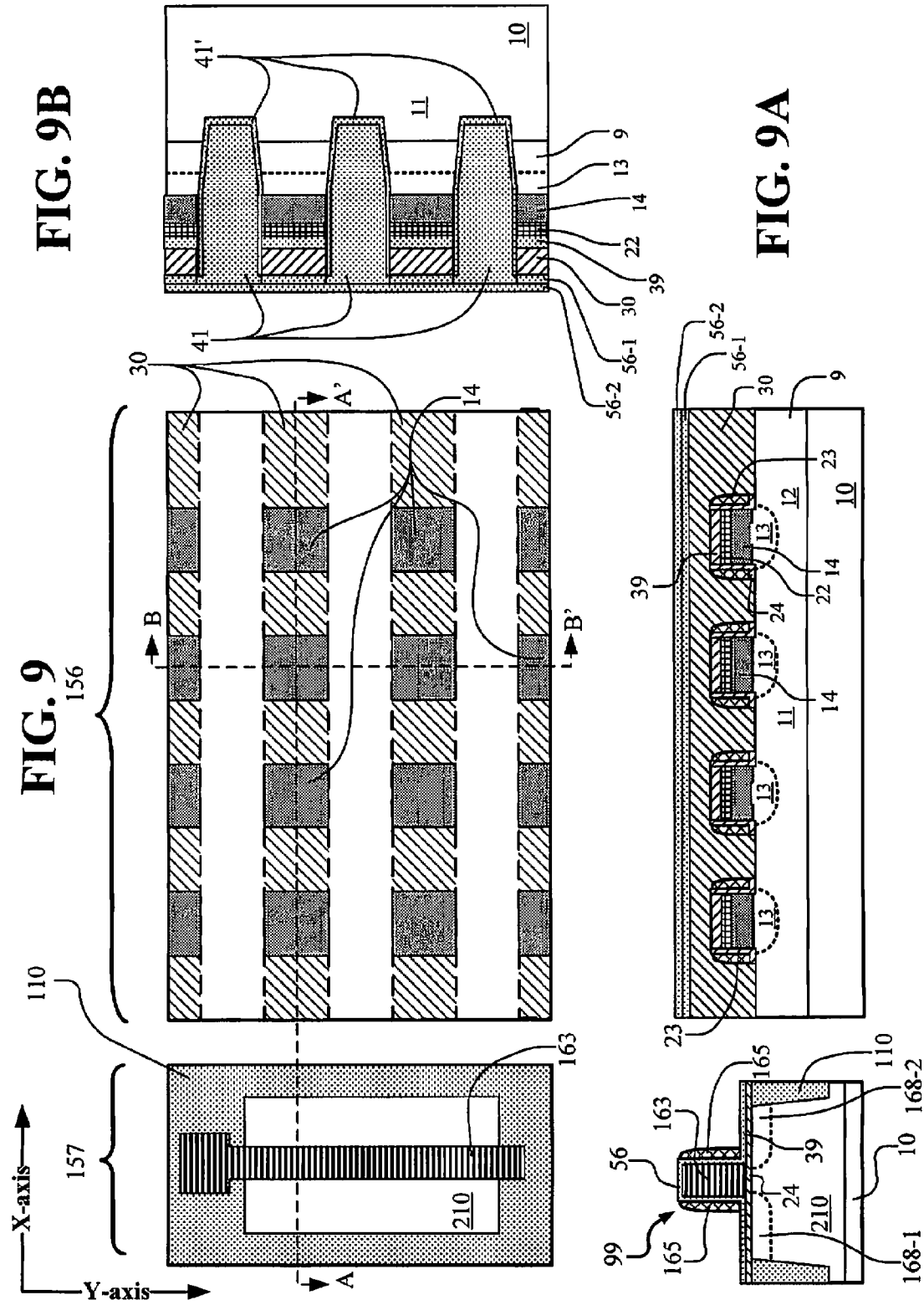

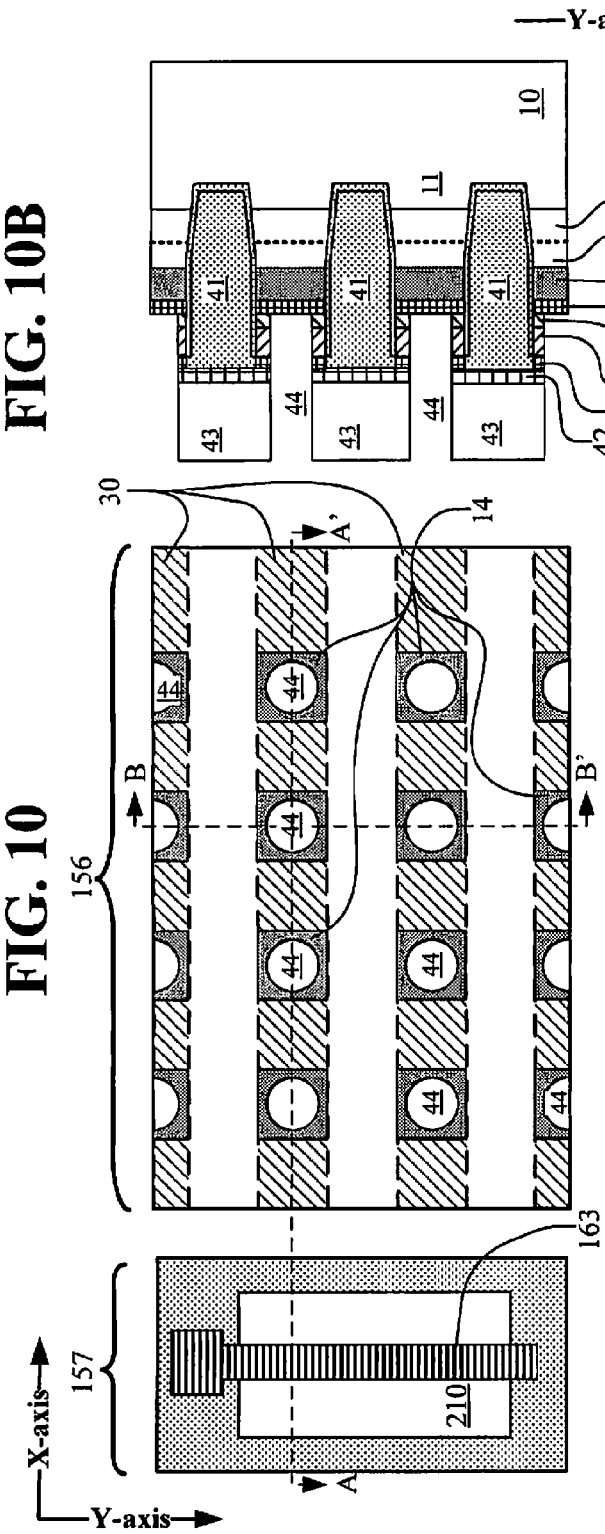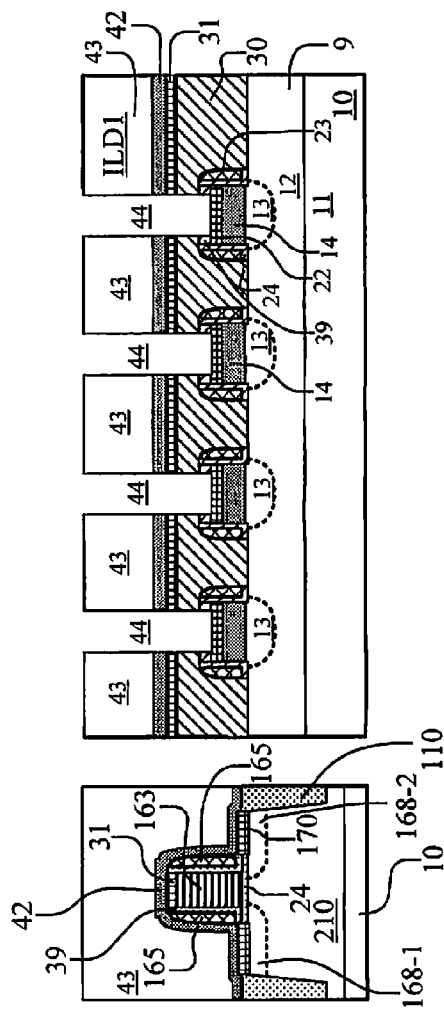

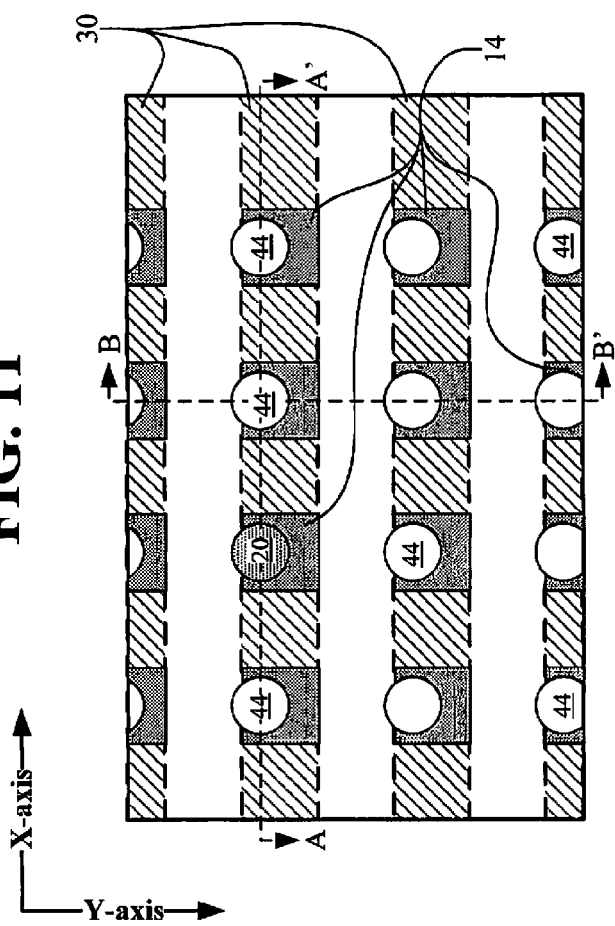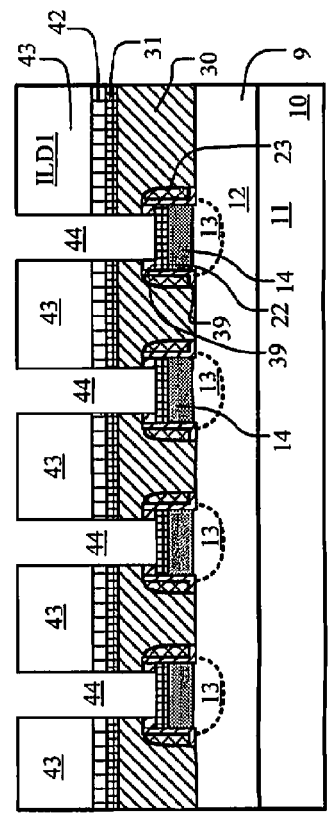

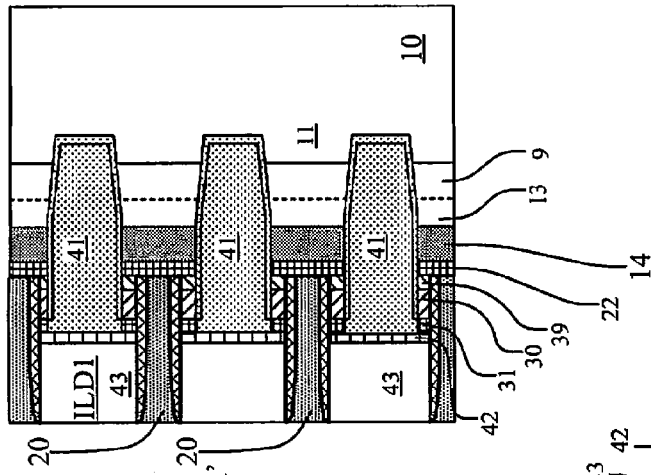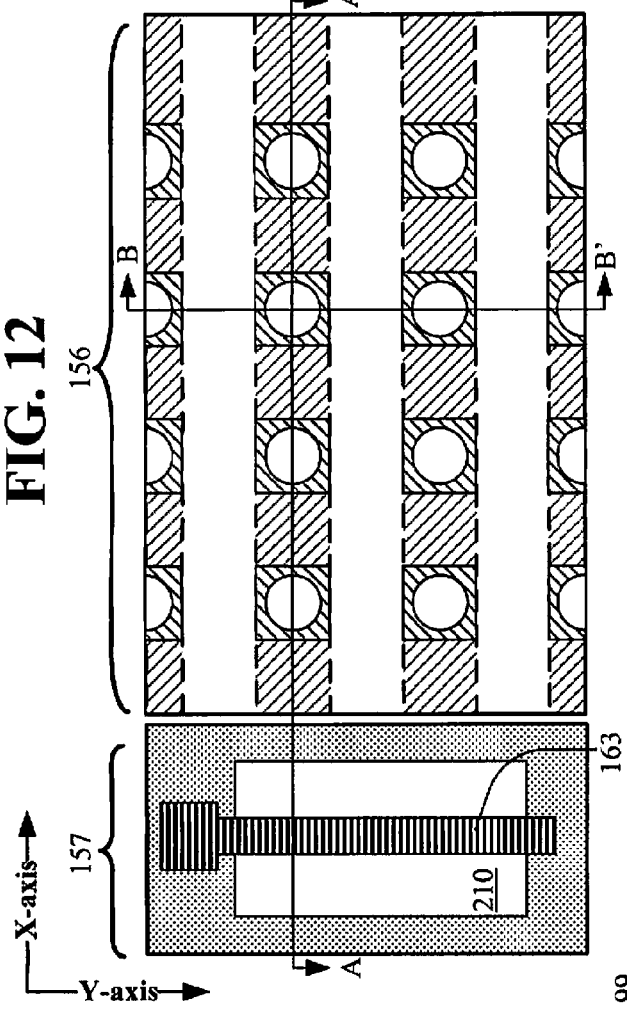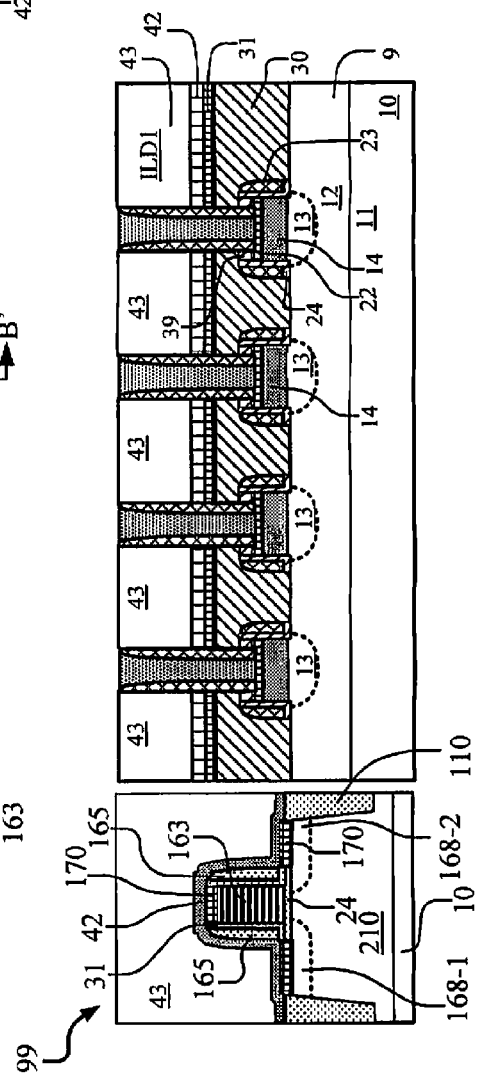

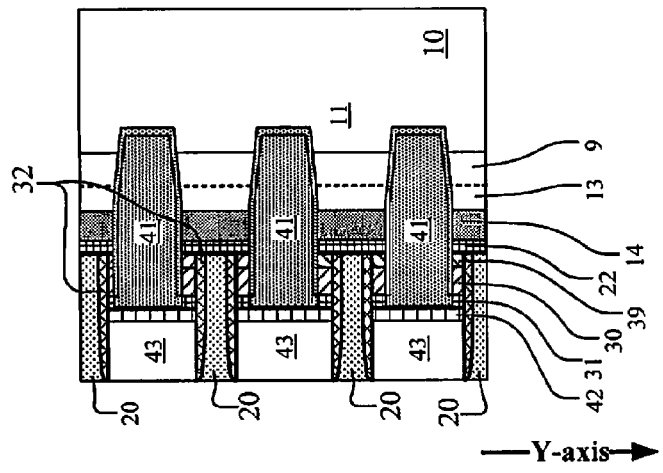
FIG. 13B
FIG. 13A
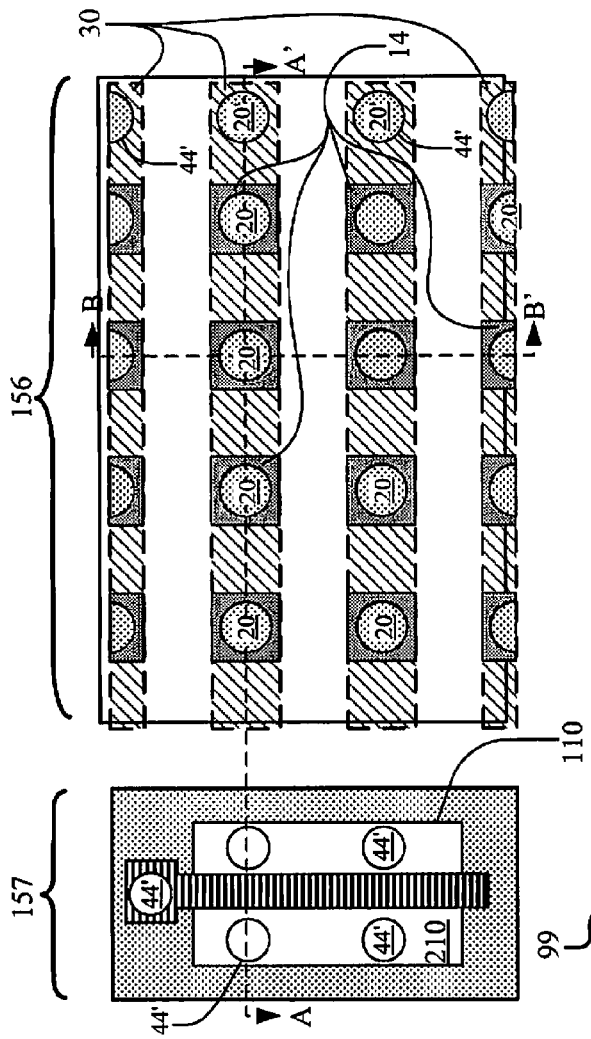
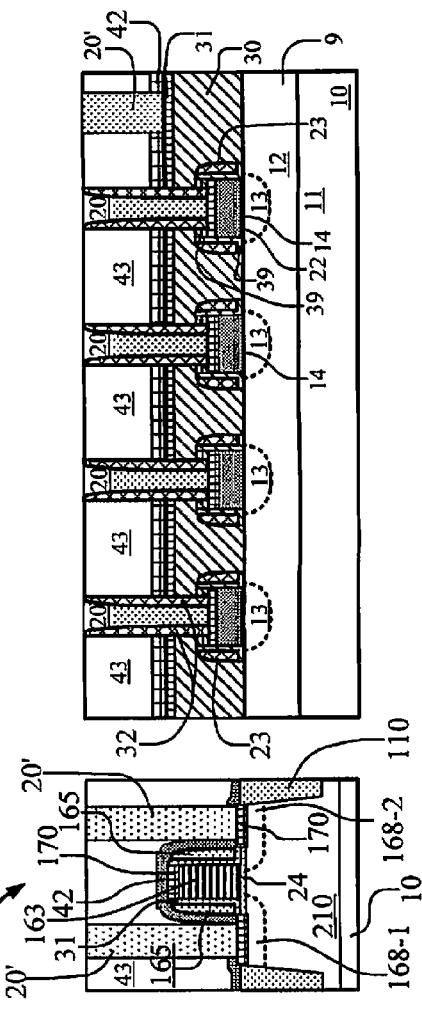
FIG. 13

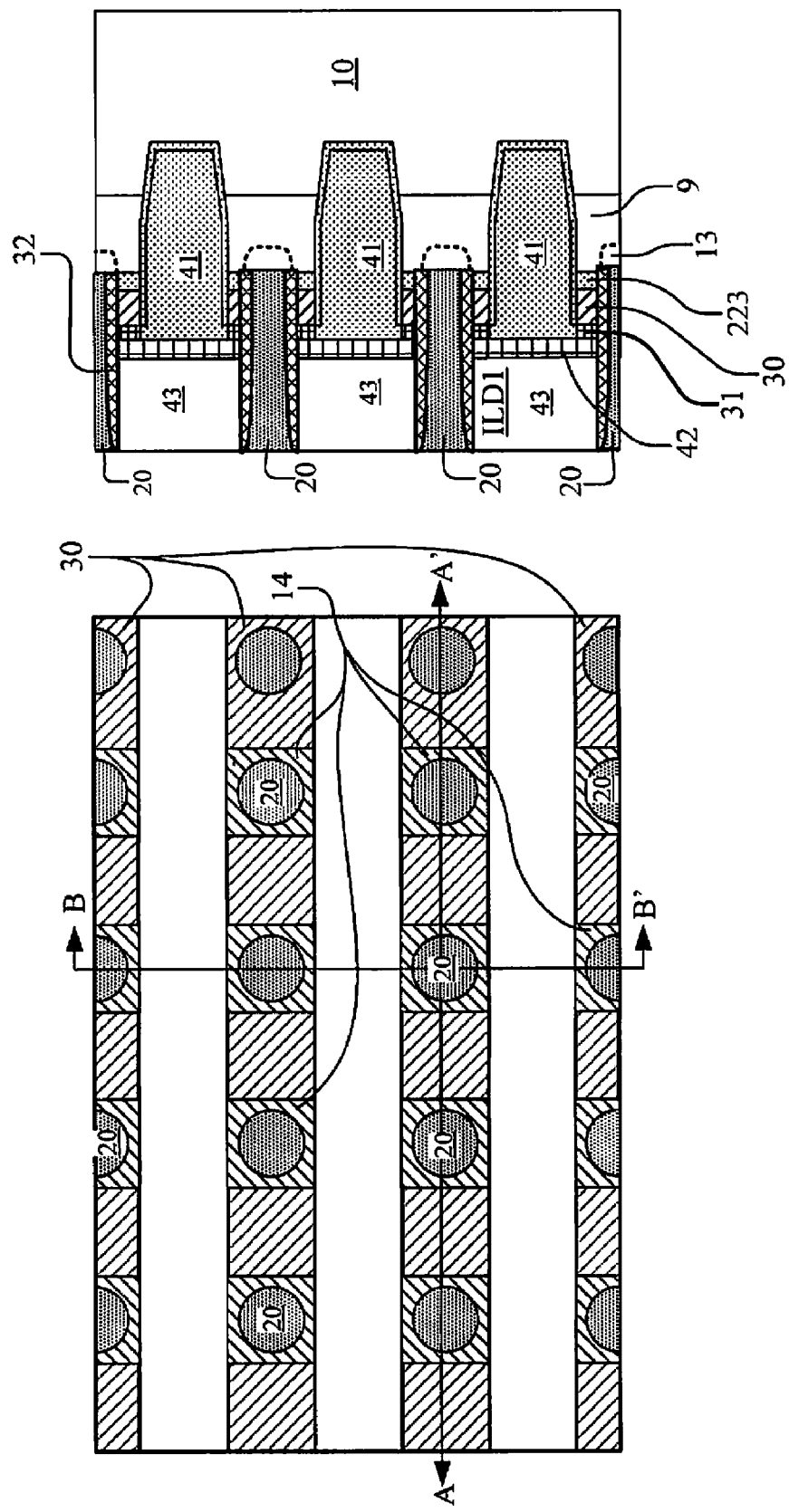

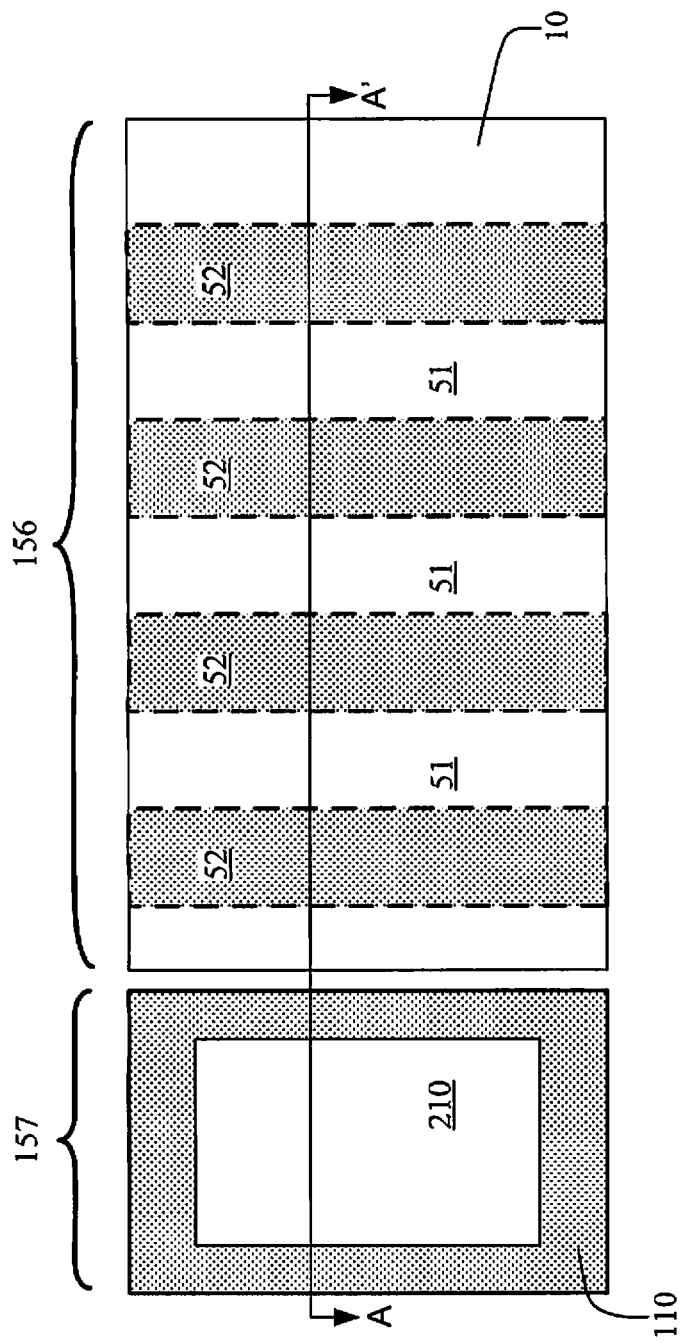
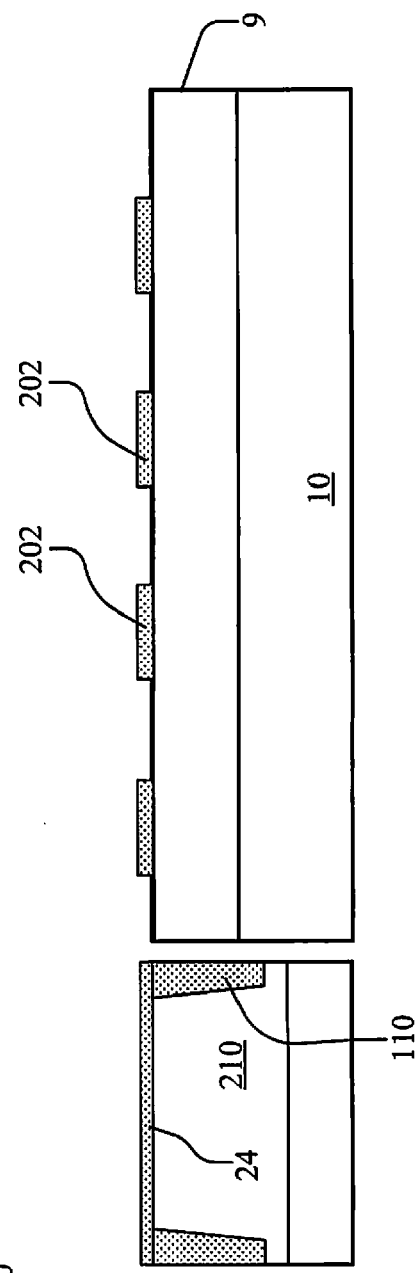
FIG. 23
FIG. 23A

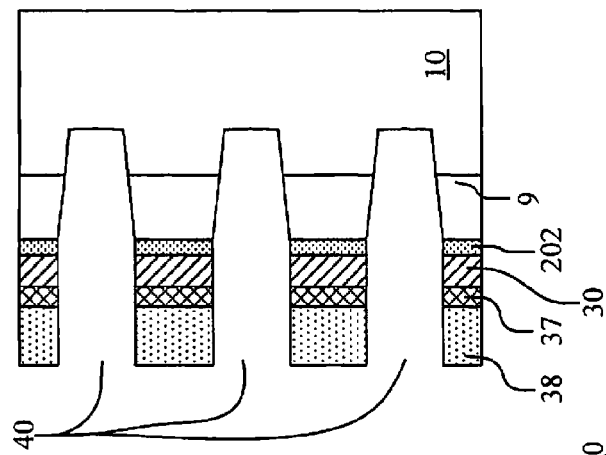
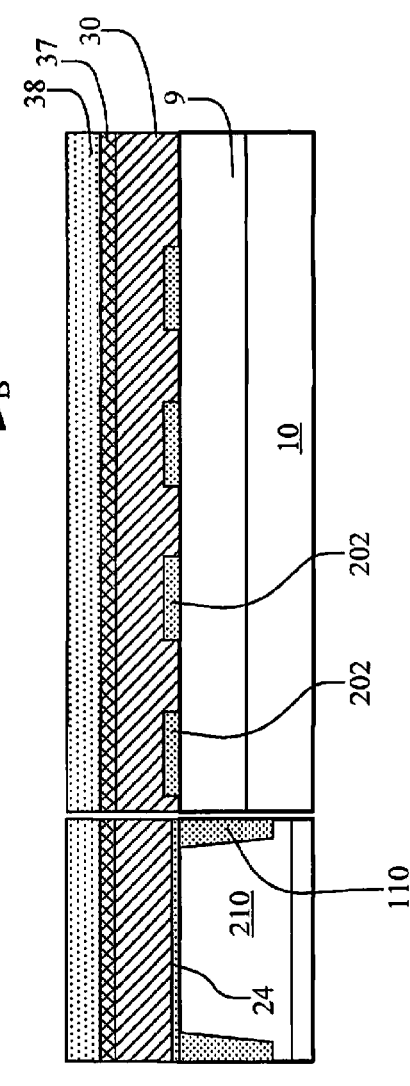
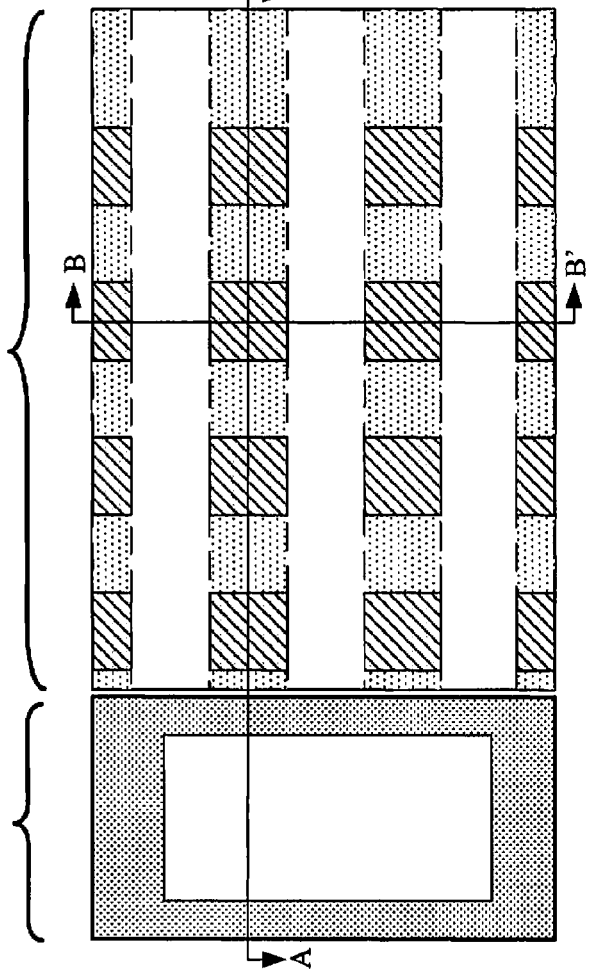

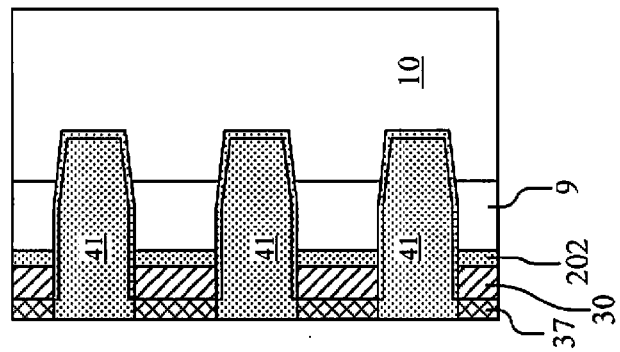
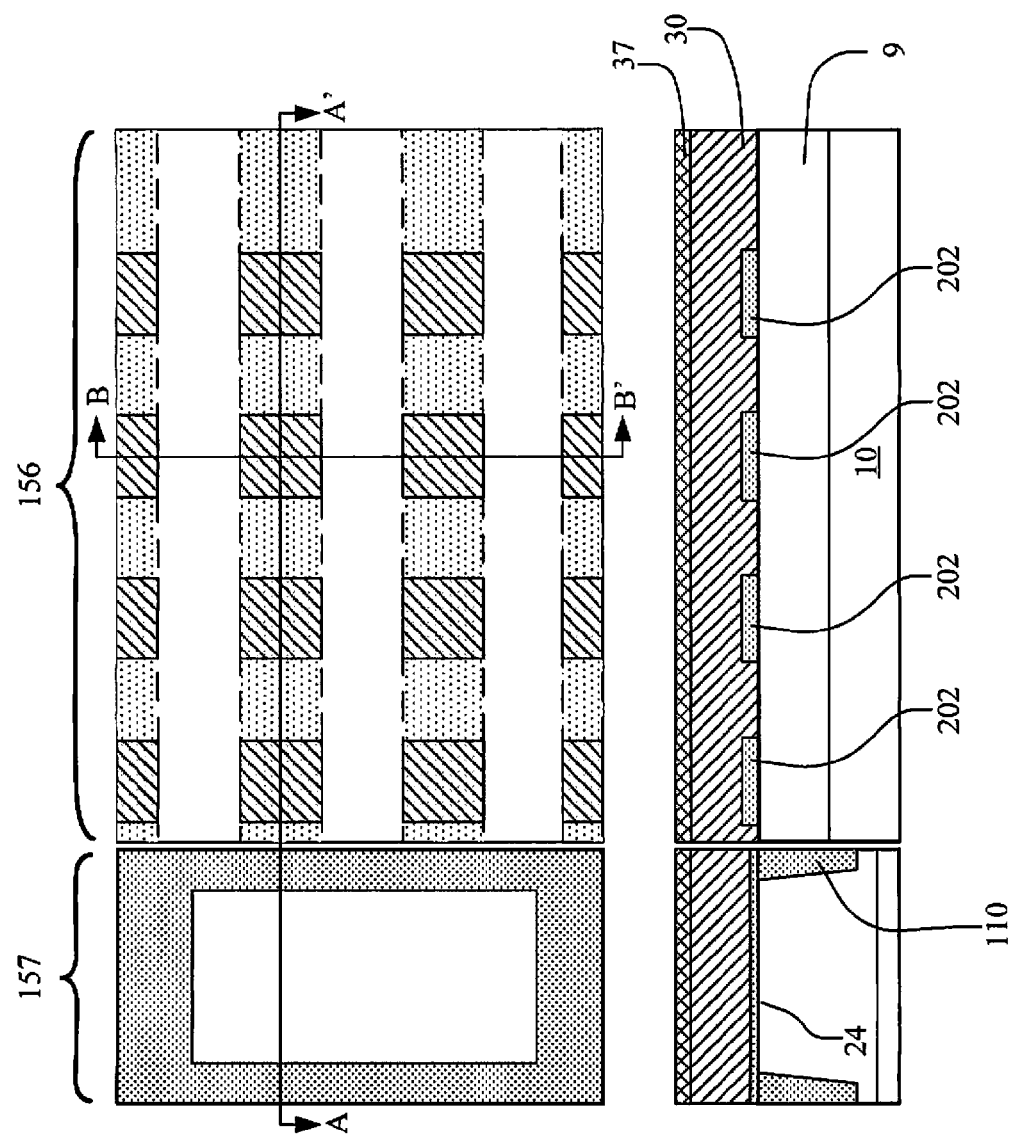

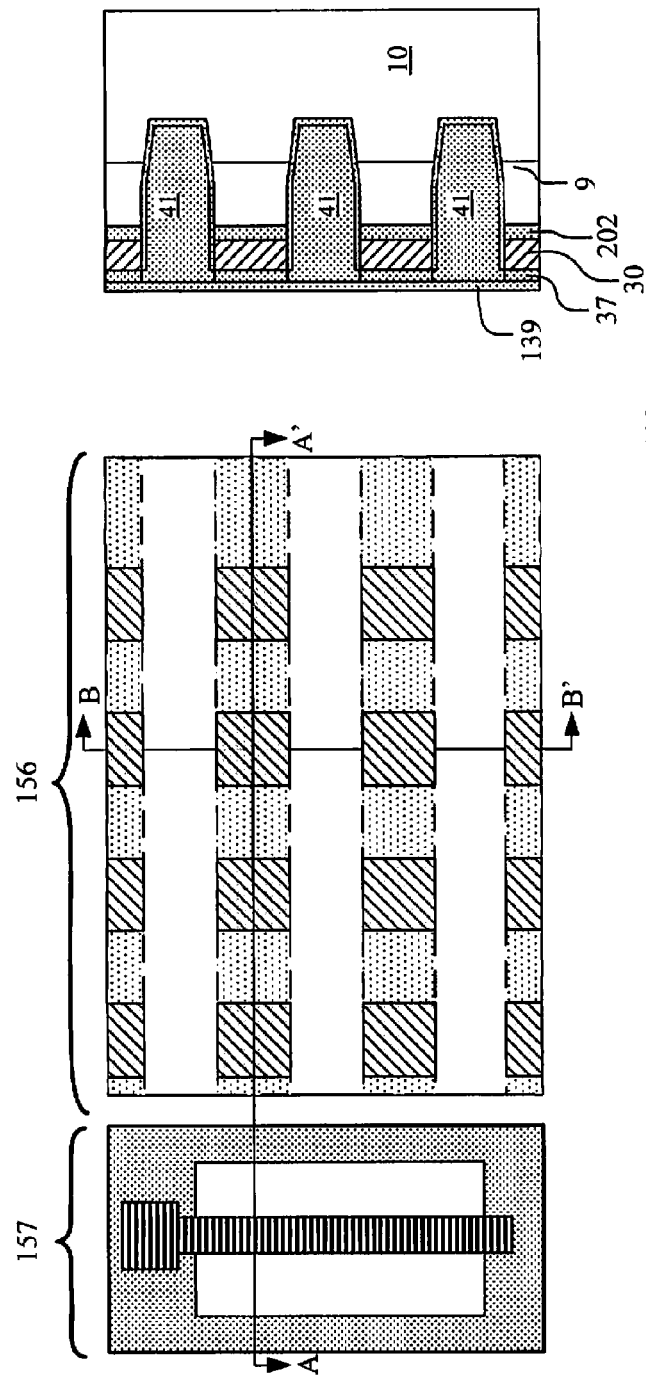
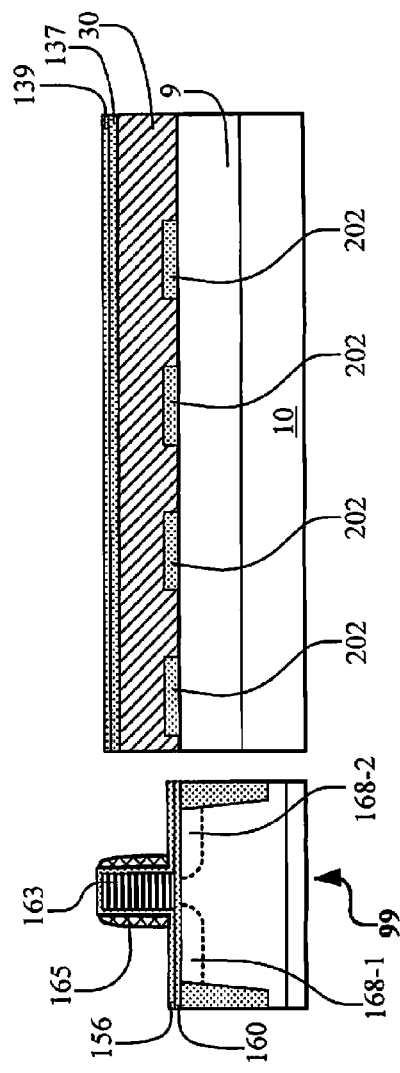
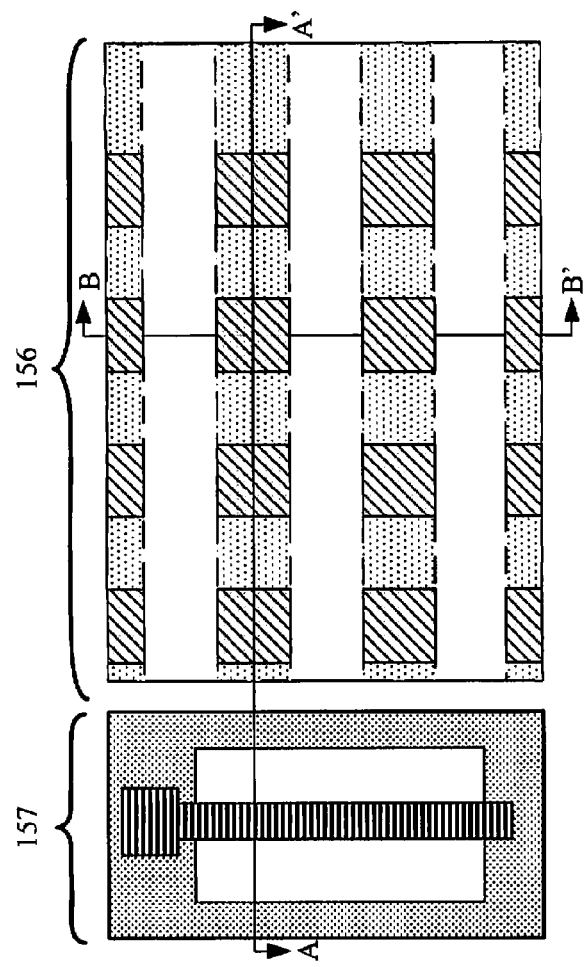
FIG. 26B
FIG. 26A
FIG. 26

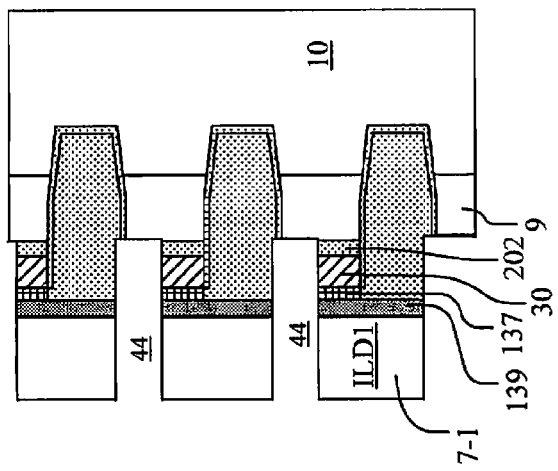
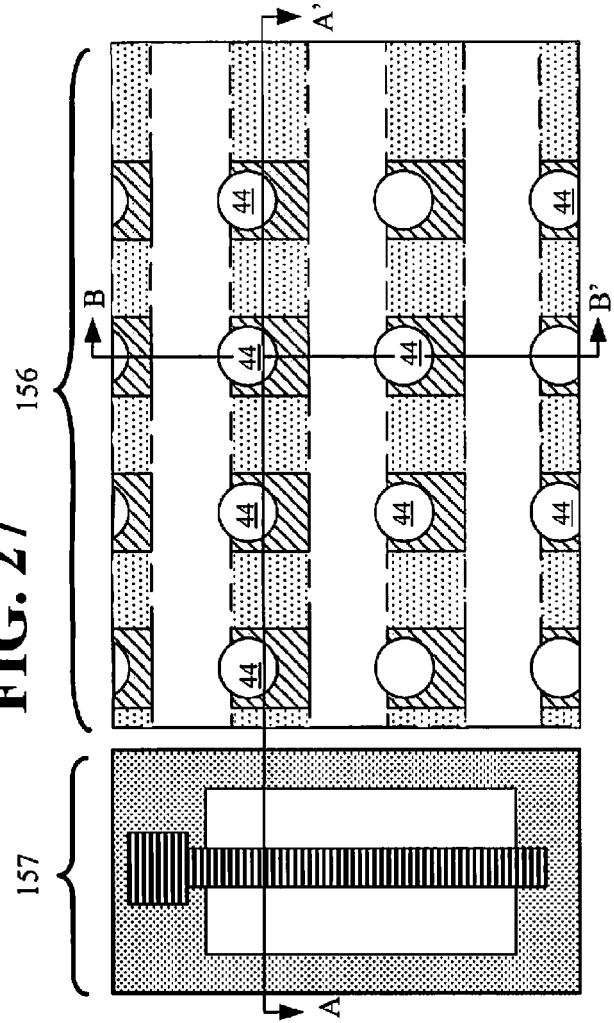
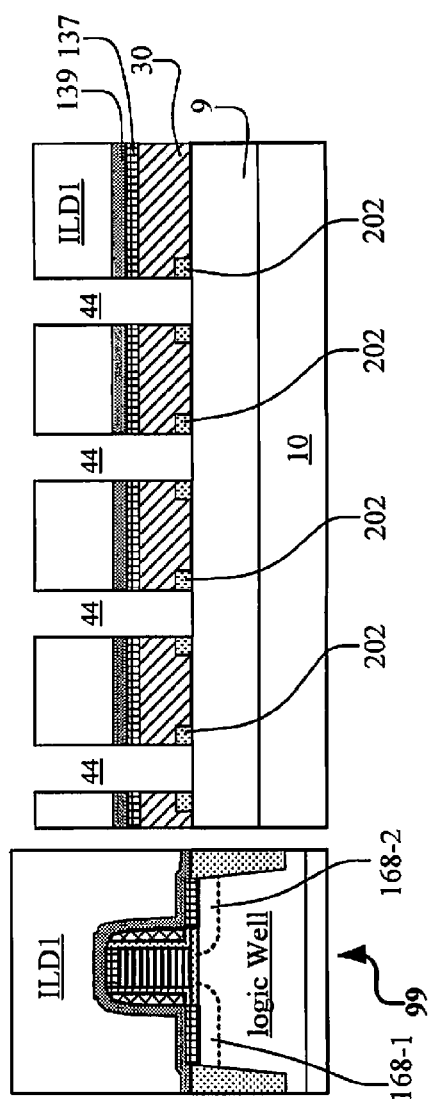
FIG. 27
FIG. 27A
FIG. 27B

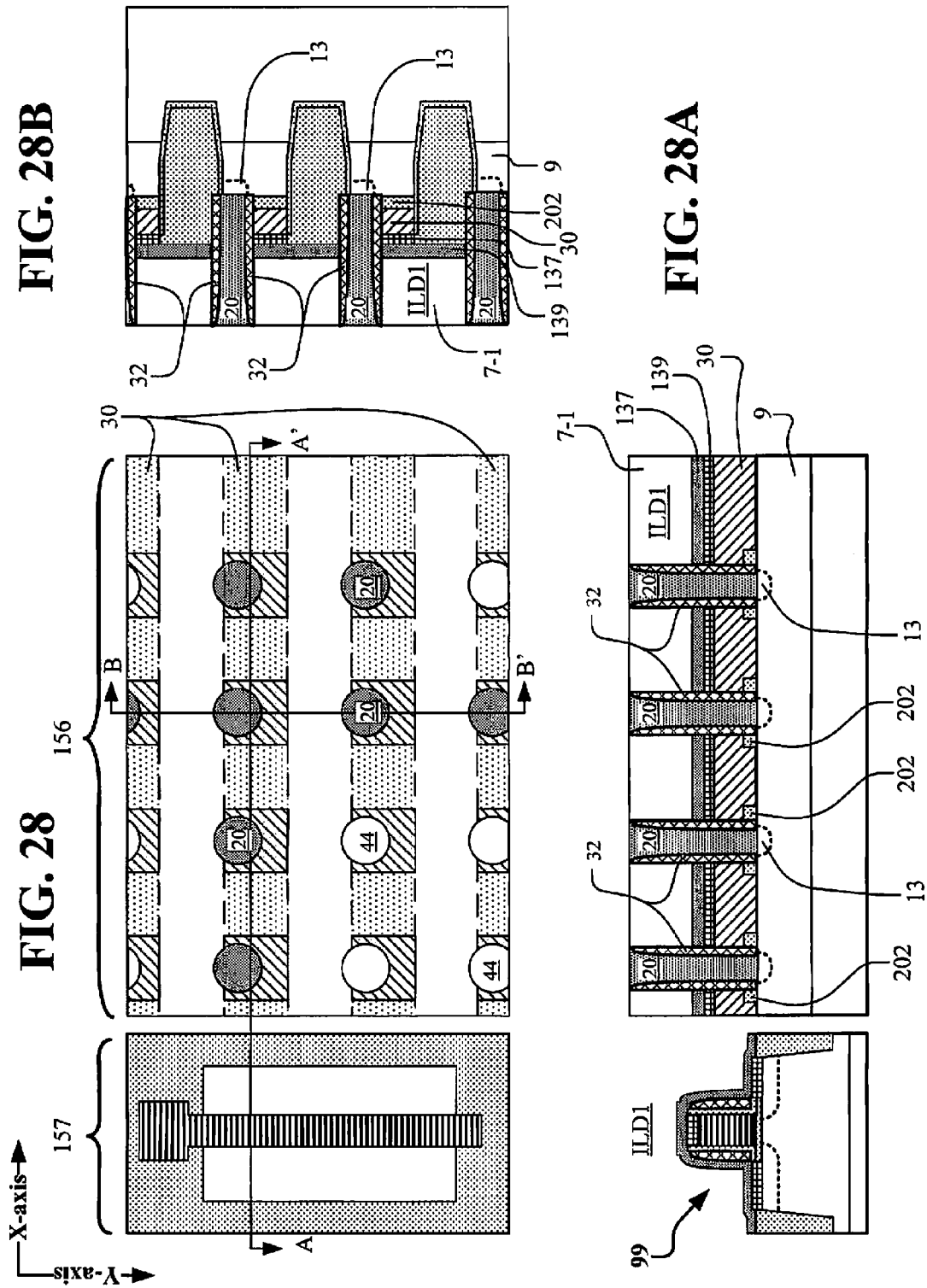

NON-VOLATILE MEMORY CELL ARRAY AND LOGIC

CROSS-REFERENCED APPLICATIONS

This application claims the benefit under 35 USC 119(e) of Provisional Patent Application U.S. Ser. No. 60/956,079, filed on Aug. 15, 2007; Inventor: Chih-Hsin Wang. Application Ser. No. 60/956,079 is hereby incorporated by reference in its entirety in the present application.

This application claims the benefit under 35 USC 119(e) of Provisional Patent Application Ser. No. 60/948,405, filed on Jul. 6, 2007; Inventor: Chih-Hsin Wang. Application Ser. No. 60/948,405 is hereby incorporated by reference in its entirety in the present application.

TECHNICAL FIELD

The present specification relates to semiconductor devices and semiconductor memory devices and to methods for arranging electrically alterable non-volatile memories and arrays.

BACKGROUND

FIG. 1 provides a prior art memory device showing two PCRAM (Phase Change Random Access Memory) cells 16-1 and 16-2 with bipolar junction transistors (BJT) 4-1 and 4-2 as control devices for operating each of the PCRAM cells 16-1 and 16-2. Each of the transistors 4-1 and 4-2 includes collector region 11, base region 12 and emitters 13. The PCRAM cells 16-1 and 16-2 are separated by the Cell Pitch. The memory cells 16-1 and 16-2 include a base connection 3-1 and 3-2, respectively. The base connections, referring to base connection 3-2 by way of example, include a heavily doped base diffusion 8, a base poly 2-1, a base contact 20-1 and an additional base contact 60-2. The cell pitch in FIG. 1 is substantially larger than the transistor 4-1 and 4-2 sizes and the cell 16-1 and 16-2 sizes since it necessarily also includes the dimensions of the base connections 3-1 and 3-2, one base connection for each transistor.

One example of bipolar junction transistors (BJT) used as control devices for operating PCRAM cells is described by Pellizzer et al, *A 90 nm Phase Change Memory Technology for Stand-Alone Non-Volatile Memory Applications,* 2006 Symposium on VLSI Technology Digest of Technical Papers.

The problems associated with the prior art memories are as follows:

1) large cell pitch (large bit cell size)

2) large parasitic base resistance, limiting cell WRITE operation (either WRITE to a "0" or WRITE to a "1"), thus limiting memory performance.

3) low bipolar gain (Hfe or $\beta$), defined as the ratio of collector current to base current.

Typically, a low base current (or a high gain) is desirable for controlling the PCRAM cell operation in a large array having high density.

There is a need for improved memory cells, arrays and logic that overcome the problems associated with the prior art memories and methods of arranging them and there is a need for arrays and memories that have small cell pitches, high cell densities and enhanced performance.

Other objects and further understanding of the objects will be realized by referencing to the specifications and drawings.

SUMMARY

A semiconductor device comprises a memory region including one or more transistor string arrays, a logic region including one or more logic transistors and an isolation region for isolating the logic transistors. The string array includes a plurality, T, of bipolar junction transistors. The string array includes a common collector region for the T bipolar junction transistors, a common base region for the T bipolar junction transistors, a plurality of emitters, one emitter for each of the T bipolar junction transistors, a number, B, of base contacts for the T bipolar junction transistors where the base contacts electrically couple the common base region and where the number of base contacts, B, is less than the number of transistors, T.

In an embodiment, the semiconductor device includes a string array of bipolar junction transistors and a plurality of memory cells, each memory cell electrically coupling a corresponding transistor.

In an embodiment, the string array of bipolar junction transistors includes for each emitter, an emitter contact electrically coupling the emitter.

In an embodiment, the emitter contact includes an emitter conductor for each string array of bipolar junction transistors where each emitter conductor includes a poly emitter juxtaposed the emitter and a poly salicide juxtaposed the poly emitter. In a further embodiments, side wall insulators are located on sidewalls of the emitter contact and on the emitter conductor and the side wall insulators are selected from the group consisting of oxide, nitride, oxynitride, alloys thereof and combinations thereof.

In an embodiment, the base region for the string array of bipolar junction transistors is a base diffusion of one conductivity type in a substrate and each of the emitters is an emitter diffusion of another conductivity type. In a further embodiment, a base salicide is juxtaposed the base diffusion and located between emitter diffusions. In a still further embodiment, an extrinsic base diffusion is between emitter diffusions and a base salicide is juxtaposed the extrinsic base diffusion.

In an embodiment of the string array of bipolar junction transistors, each of the emitters and the common collector region are of one conductivity type and the base region is of another conductivity type. For each emitter, an emitter conductor is juxtaposed the emitter, side wall insulators are located on sidewalls of the emitter conductor, an emitter contact is juxtaposed the emitter conductor, a base salicide is juxtaposed the base region and located between emitter conductors. An interlayer dielectric is juxtaposed the base salicide and disposed about the side wall insulators and about the base contact.

In an embodiment, the string array of bipolar junction transistors includes for each emitter, an emitter contact electrically coupling the emitter, side wall insulators located on sidewalls of the emitter contacts, and a base conductor 3 region juxtaposed the base diffusion and disposed about the sidewalls. In a further embodiment, the base conductor region includes, a base poly juxtaposed the base diffusion, and a base salicide juxtaposed the base poly. In a still further embodiment, the base poly includes a surface and the base salicide covers the surface.

In a further embodiment, the base poly includes a top surface and a side wall surface and the base salicide covers the top surface and the side wall surface.

In a further embodiment, an inter-layer dielectric juxtaposed the base conductor region and disposed about the side wall insulators and about the base contact.

In a further embodiment, for the plurality of memory cells, each memory cell electrically couples a corresponding emitter of the string array, one or more word lines electrically couples the memory cells.

In a further embodiment, the base contact electrically couples a device line.

In a further embodiment, the base contact is in contact with the device line.

In a further embodiment, the base contact extends to the device line through an additional contact.

In a further embodiment, the base contact extends to the device line through a first additional contact and extends to another device line through a second additional contact.

In an embodiment, the semiconductor device includes a string array of bipolar junction transistors and a plurality of memory cells, each memory cell electrically coupling a corresponding emitter of the string array of bipolar junction transistors, and one or more word lines electrically coupling the memory cells.

In an embodiment, the semiconductor device includes a plurality of transistors in the string array spaced apart by a cell pitch and a plurality of memory cells in a memory array spaced apart by the cell pitch. The cell pitch is small since base contacts are not required between each transistor.

The foregoing and other objects, features and advantages of the invention will be apparent from the following detailed description in conjunction with the drawings.

BRIEF DESCRIPTION OF THE DRAWINGS

FIG. 3 depicts a top view of a semiconductor device formed as string arrays of transistors of FIG. 2. FIG. 3A (NS) is not shown since a cross section along section line AA' of FIG. 3 appears as FIG. 2. FIG. 3B, FIG. 3C and FIG. 3D depict cross-sectional views along section lines of FIG. 3.

FIG. 6 and FIG. 6A depict semiconductor structures for arranging string arrays and PCM memories in embodiments of the present specification.

FIG. 7 and FIG. 7A and FIG. 7B show a top view and cross-sectional views of additional semiconductor structures for arranging string arrays and PCM memories in embodiments of the present specification.

FIG. 8 and FIG. 8A and FIG. 8B show a top view and cross-sectional views of additional semiconductor structures for arranging string arrays and PCM memories in embodiments of the present specification.

FIG. 9 and FIG. 9A and FIG. 9B a top view and cross-sectional views of additional semiconductor structures for arranging string arrays and PCM memories in embodiments of the present specification.

FIG. 10 and FIG. 10A and FIG. 10B show a top view and cross-sectional views of additional semiconductor structures for arranging string arrays and PCM memories in embodiments of the present specification.

FIG. 11 and FIG. 11A and FIG. 11B show a top view and cross-sectional views of additional semiconductor structures for arranging string arrays and PCM memories in embodiments of the present specification.

FIG. 12 and FIG. 12A and FIG. 12B show a top view and cross-sectional views of additional semiconductor structures for arranging string arrays and PCM memories in embodiments of the present specification.

FIG. 13 and FIG. 13A and FIG. 13B show a top view and cross-sectional views of additional semiconductor structures for arranging string arrays and PCM memories in embodiments of the present specification.

FIG. 14 and FIG. 14A and FIG. 14B show a top view and cross-sectional views of additional semiconductor structures for arranging string arrays and PCM memories in embodiments of the present specification.

FIG. 15 and FIG. 15A and FIG. 15B show a top view and cross-sectional views of additional semiconductor structures for arranging string arrays and PCM memories in embodiments of the present specification.

FIG. 16 and FIG. 16A and FIG. 16B show a top view and cross-sectional views of additional semiconductor structures for arranging string arrays and PCM memories in embodiments of the present specification.

FIG. 17 and FIG. 17A and FIG. 17B show a top view and cross-sectional views of additional semiconductor structures for arranging string arrays and PCM memories in embodiments of the present specification.

FIG. 19 depicts a top view and FIG. 19B, FIG. 19C and FIG. 19D depict cross-sectional views along section lines of the semiconductor device of FIG. 19. FIG. 19A (NS) is not shown since cross sections along section line AA' of FIG. 19 appear as FIG. 18, FIG. 18A or FIG. 18B.

FIG. 23 and FIG. 23A depict semiconductor materials and steps for further arranging string arrays and PCM memories following the semiconductor materials and steps of FIG. 22 and FIG. 22A.

FIG. 24, FIG. 24A and FIG. 24B depict semiconductor materials and steps for further arranging string arrays and PCM memories in embodiments of the present specification.

FIG. 25, FIG. 25A and FIG. 25B depict semiconductor materials and steps for further arranging string arrays and PCM memories in embodiments of the present specification.

FIG. 26, FIG. 26A and FIG. 26B depict semiconductor materials and steps for further arranging string arrays and PCM memories in embodiments of the present specification.

FIG. 27, FIG. 27A and FIG. 27B depict semiconductor materials and steps for further arranging string arrays and PCM memories in embodiments of the present specification.

FIG. 28, FIG. 28A and FIG. 28B depict semiconductor materials and steps for further arranging string arrays and PCM memories in embodiments of the present specification.

DETAILED DESCRIPTION

Figure 1:
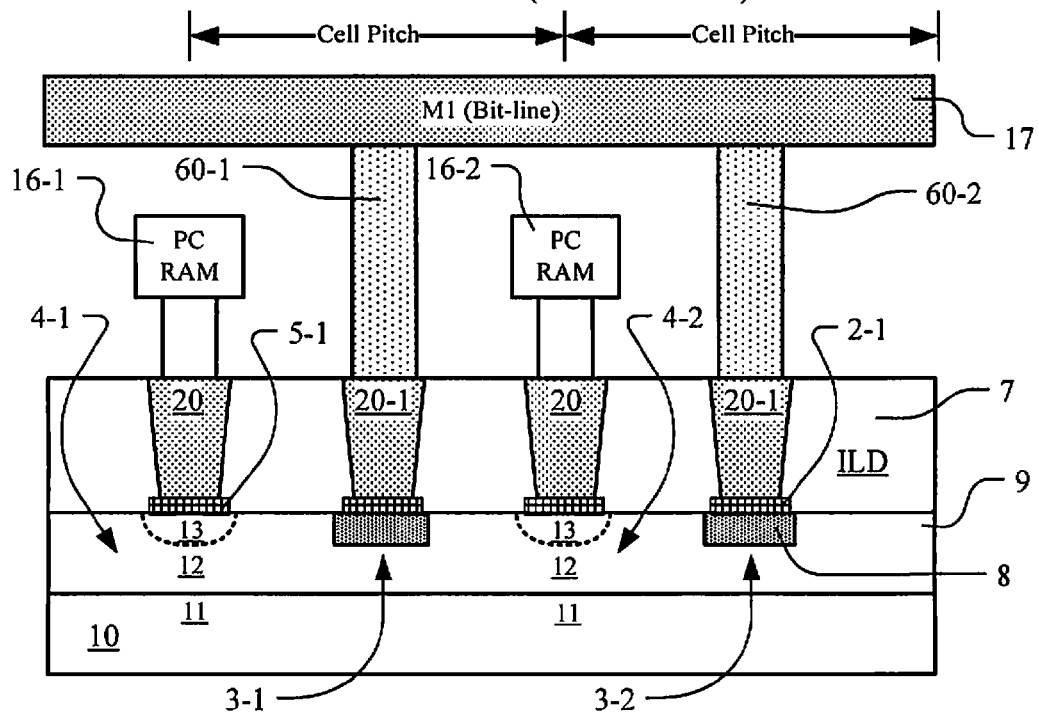
FIG. 1 depicts a cross-sectional view of a memory cell structure arranged according to the prior art.

In FIG. 1, a cross-sectional view of a memory structure is shown arranged according to the prior art as previously described.

Figure 2:
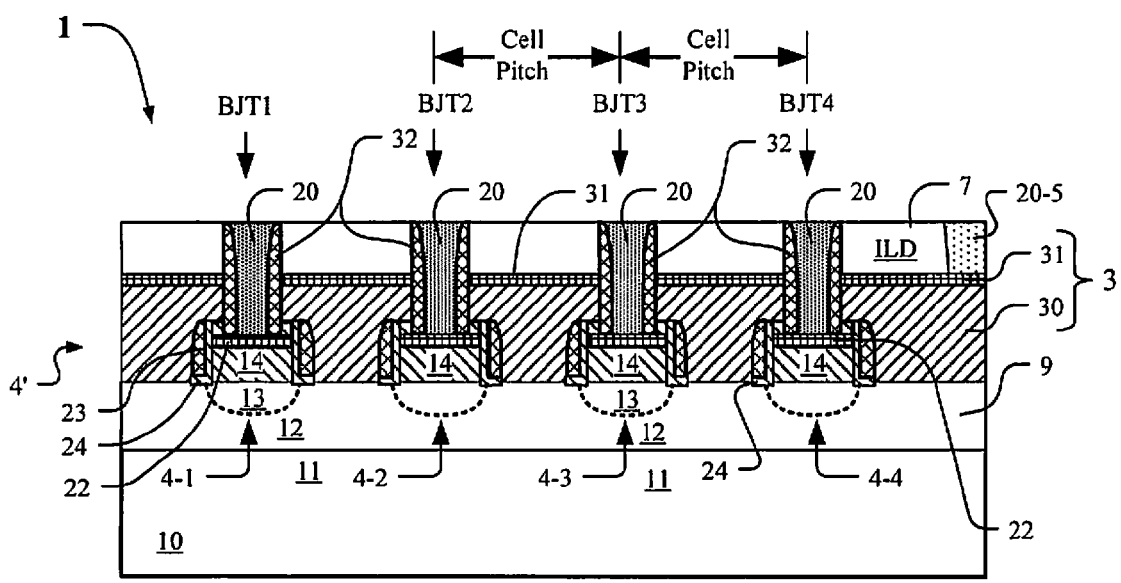
FIG. 2 depicts a cross-sectional view of a memory structure comprising a semiconductor device formed using string arrays of bipolar junction transistors in accordance with an embodiment of the present specification.

FIG. 2 depicts a cross-sectional view of a cell structure comprising a semiconductor device 1 formed as a string array 4' in accordance with an embodiment of the present specification. In FIG. 2, each of the transistors 4, including transistors 4-1, 4-2, 4-3 and 4-4, includes a common collector region 11, a common base region 9 and a plurality of emitters 13, one emitter for each of the bipolar junction transistors 4. The bases 12 for the transistors 4 are part of a single common base region 9 for the string array 4' of transistors 4-1, 4-2, 4-3 and 4-4. The common base region 9 connects to and electrically couples a base contact 3 for the plurality of bipolar junction transistors 4. The base conductor 3 is formed of one or more good conductors, for example, a base salicide 31 and a base poly 31.

The transistors 4-1, 4-2, 4-3 and 4-4 are arrayed at the cell pitch. The cell pitch in FIG. 2 is established by the element spacing of the transistors 4-1, 4-2, 4-3 and 4-4 and does not have interspersed contacts such as the contacts 3-1 and 3-2 of FIG. 1. The single base contact 3 connects to region 9 and hence to the bases 12 for each of the plurality of bipolar junction transistors 4-1, 4-2, 4-3 and 4-4.

In FIG. 2, the emitters 13 and the collector region 11 are arranged with a first type of conductivity (for example, p-type), and the base region 9 is with a second type of conductivity (for example, n-type). The collector of each of the transistors 4-1, 4-2, 4-3 and 4-4 is part of the common collector region 11. The base 12 of each of the transistors 4-1, 4-2, 4-3 and 4-4 is part of the common base diffusion region 9.

A poly salicide 22 is located on the poly emitters 14. Each poly emitter 14 is contacted through a salicide 22 by an emitter contact 20 so that emitter contact 20 electrically couples emitter 13. The emitter contacts 20 and the base contact 20-5 are typically formed of metal, such as tungsten (W), aluminum (Al), Copper (Cu) by way of example. The salicides 22 reduce parasitic resistance and contact resistance. An insulator 24 surrounds the poly emitters 14 and in the embodiment of FIG. 2 additionally includes sidewall spacers 23 that are good insulators such as nitrides. An interlayer dielectric (ILD) 7 surrounds the sidewall insulators 32 of the emitter contacts 20, the insulator 24 and the sidewall insulators 23.

FIG. 2 provides a plurality of bipolar junction transistors 4 (BJTs), such as BJT1, BJT2, BJT3, and BJT4, arranged in a bipolar junction transistor string 4' in accordance with one embodiment of the present specification. Each bipolar junction transistor 4 has an emitter 13, an emitter conductor (14, 22), a base 12, a base conductor 3, and a collector 11. The emitter 13 and the collector 11 is arranged with a first type of conductivity (for example, p-type), and the base 12 is arranged with a second type of conductivity (for example, n-type). The collector 11 of each bipolar junction transistor 4 is shown shared with other collectors. The base 12 of each bipolar junction transistor 4 is coupled with the base of an adjacent bipolar junction transistor 4 through a base diffusion 9 having the second type conductivity. The base conductor 3 is provided as a interconnect connecting the base 12 of each bipolar junction transistor 4 in one electrode. The base conductor 3 is disposed over and contacting the base diffusion 9, and in one embodiment comprises a polysilicon. The base conductor 3 is silicided by providing metal silicide 31 (for example, TiSi, CoSi, PtSi, NiSi etc) atop of the polysilicon 30. A base contact 20-5 typically comprising a metal (for example, tungsten (W), aluminum (Al), Copper (Cu) etc) is provided to make connection to the base conductor 3. The silicided base conductor 3 is preferable and provides advantages on reducing the parasitic resistance between the base 12 of each bipolar junction transistor 4 and the base contact 3. The silicided base 12 further provides an advantage on reducing the contact resistance of the base 12.

The emitter conductor (14, 22) is typically self-aligned to the emitter 13 of the bipolar junction transistor 4. In a preferred embodiment, the emitter conductor (14, 22) comprises an emitter poly 14 with a silicide 22 (poly silicide) atop thereof. Each emitter conductor (14, 22) is contacted by an emitter contact 20 typically formed of metal, for example, W, Al, Cu etc.

Each contact 20 is insulated from an adjacent contact 20 by an insulator. For example, the base contact 20 is insulated from the emitter contact (14, 22) of bipolar junction transistor 4 by a first inter-layer-dielectric 7 (ILD1). Further, each emitter contact (14, 22) is insulated from the base conductor 3 by contact sidewall spacers 32, which are typically made of an insulator such as nitride. Each contact 20 is typically connected to a metal line (not shown) through which proper voltage is applied to operate the bipolar junction transistor 4.

The structure in FIG. 2 provides a unique advantage that the plurality of bipolar junction transistors share a common base contact 20-5, thus minimizing area occupied by overhead, such as area taken by multiple base contacts such as base contacts 3-1 and 3-2 in FIG. 1. Such advantage is important as it permits bipolar junction transistors constructed in large array density (for example, giga scale density).

In FIG. 3, a top view of a semiconductor device 1 formed as string arrays 4' of transistors of FIG. 2. The designation "FIG. 3A (NS)" appears in the drawings since no FIG. 3A is shown because a cross section along section line AA' of FIG. 3 appears as FIG. 2.

In FIG. 3, there are four strings shown, for example the string along section line AA' which is shown in a sectional view in FIG. 2. Each string includes a base conductor line 30 contacting the base diffusion 9 (see FIG. 2). Each emitter conductor (see 14, 22 in FIG. 2) connects to an emitter contact 20. In FIG. 3, emitter contacts 20 are shown along the section line BB' whereas the other locations for contacts are shown as holes 44 that will receive emitter contacts 20 in subsequent processing. Each base conductor line 30 is shown connected to an emitter contact 20 (or hole 44 for receiving an emitter contact 20) and in general can be connected to one or more of such contacts. In FIG. 3, the holes 44' are for receiving contacts connecting to base contacts (see base contact 20-5 in FIG. 2).

In FIG. 3B, a cross-sectional view is shown for one embodiment along section line BB' for the device 1 of FIG. 3.

In FIG. 3C, a cross-sectional view is shown for another embodiment along section line BB' for the device 1 of FIG. 3.

The difference between the embodiments of FIG. 3C and FIG. 3B is in the base conductor 3 architecture. In FIG. 3C, the base conductor 3 comprises two layers of conductors, namely conductor 30-1 and conductor 30-2, in addition to the base silicide layer 31 in both FIG. 3B and FIG. 3C. As illustrated, the base conductor 3 of the present specification need not be one layer but can be more than one layer of conductors. Similarly, the emitter conductors 20 need not be one layer but can be more than one layer of conductors.

The manufacturing method for forming the structure of the FIG. 3B type can also be used for other embodiments of the present specification such as one provided in FIG. 3C. For example, after removing the thick nitride 37 in the structure (see FIG. 8), an additional conductor (conductor 30-2) can be formed on top of the conductor 30-1 followed by a masking step defining an etching mask to define the region of the conductor 30-2 such that the conductor 30-2 is wider than the width of conductor 30-1 in FIG. 3C by a offset $T_B$.

FIG. 3D provides another embodiment for the present specification. The difference between FIG. 3C and FIG. 3D is on the silicide architecture for the base conductor 3 including two conductors 30-1 and 30-2. The additional conductor (conductor 30-2) can be formed on top of the conductor 30-1 followed by a masking step defining an etching mask to define the region of the conductor 30-2 and the silicide 31 such that the conductor 30-2 and silicide 31 is wider than the width of conductor 30-1 in FIG. 3D by a offset $T_C$. The FIG. 3D device provides the silicide 31 covering both the top surface and the sidewall (or edge) of the base conductor 3-2.

The architecture and offsets provided in both FIG. 3C and FIG. 3D are desirable for nanometer geometry structures as they permit a wider region in the base conductor 3 for forming the base silicide 31.

Figure 4:
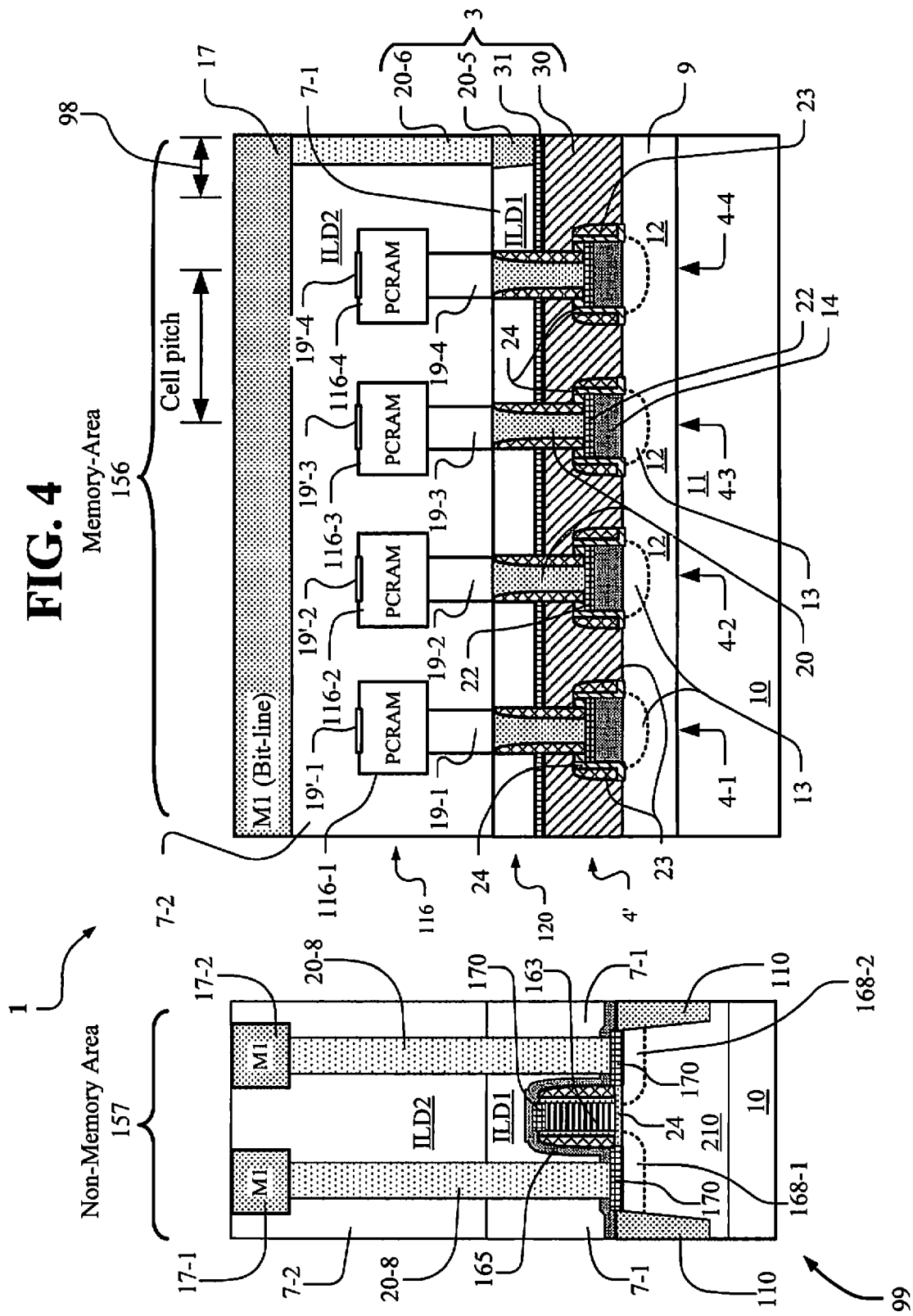
FIG. 4 depicts a cross-sectional view of the string array of a PCRAM memory (PCM) having non-memory area and memory area.

In FIG. 4, a cross-sectional view is shown of the string array of a Phase-Change Random-Access-Memory (PCRAM) device 1 having non-memory area 157 and memory area 156. The memory device 1 includes a bipolar junction transistor string 4' which is, for example, of the FIG. 2 and FIG. 3 type. In FIG. 4, the bipolar junction transistor string 4' of the FIG. 2 type is provided in the memory area 156. The string 4' comprises a plurality of bipolar junction transistors 4 and a plurality of PCRAMs 116 including PCRAMs 116-1, 116-2, 116-3 and 116-4. Each PCRAM 116 is connected to a bipolar junction transistor 4 of the FIG. 2 type. The non-memory area 157 comprises one or more CMOS logic FETs 99 (field-effect transistors) each having a gate 163, a drain 168-2, and a source 168-1 in a logic well 210.

Each PCRAM 116 is a two terminal device, having one terminal 19 connected to the poly emitter 22 of one bipolar junction transistor 4 through an emitter contact 20 and the other terminal connected to a word line 19' (WL) metal at metal 2 (M2) level which is typically running along the direction vertical to the sheet of the drawing. The word line metal 19' is connected to the PCRAM 116 through a conventional strapping method.

Each PCRAM 116 is isolated from an adjacent PCRAM 116 on the same string by an insulator, for example, interlayer dielectric 7-2 (ILD2).

The present specification provides a string architecture for memory area 156. FIG. 4 shows four cells, each having a bipolar junction transistor 4 tied to a corresponding PCRAM 116, along with a strapping base cell 98 for the base contact 20-5. The base conductor 3 is connected to a bit-line formed at metal 1 (M1) through a general contact 20-6. Typically, the bit-line 17 is arranged to run along the string direction, and each string can comprises 4, 8, 16 cells or more. The general contacts 20-8 are also used for contacting metal 1 to the source 168-1, drain 168-2 and gate 163 of field-effect transistors 99.

The base conductor 3 significantly lowers the base parasitic resistance (100 to 500 times lower is typical). The advantage on a lower parasitic resistance permits bipolar junction transistors 4 constructed in a string 4' form to minimize overhead in cell area. As shown in FIG. 4, the cell pitch is half of that for the prior art cell in FIG. 1.

Figure 5:
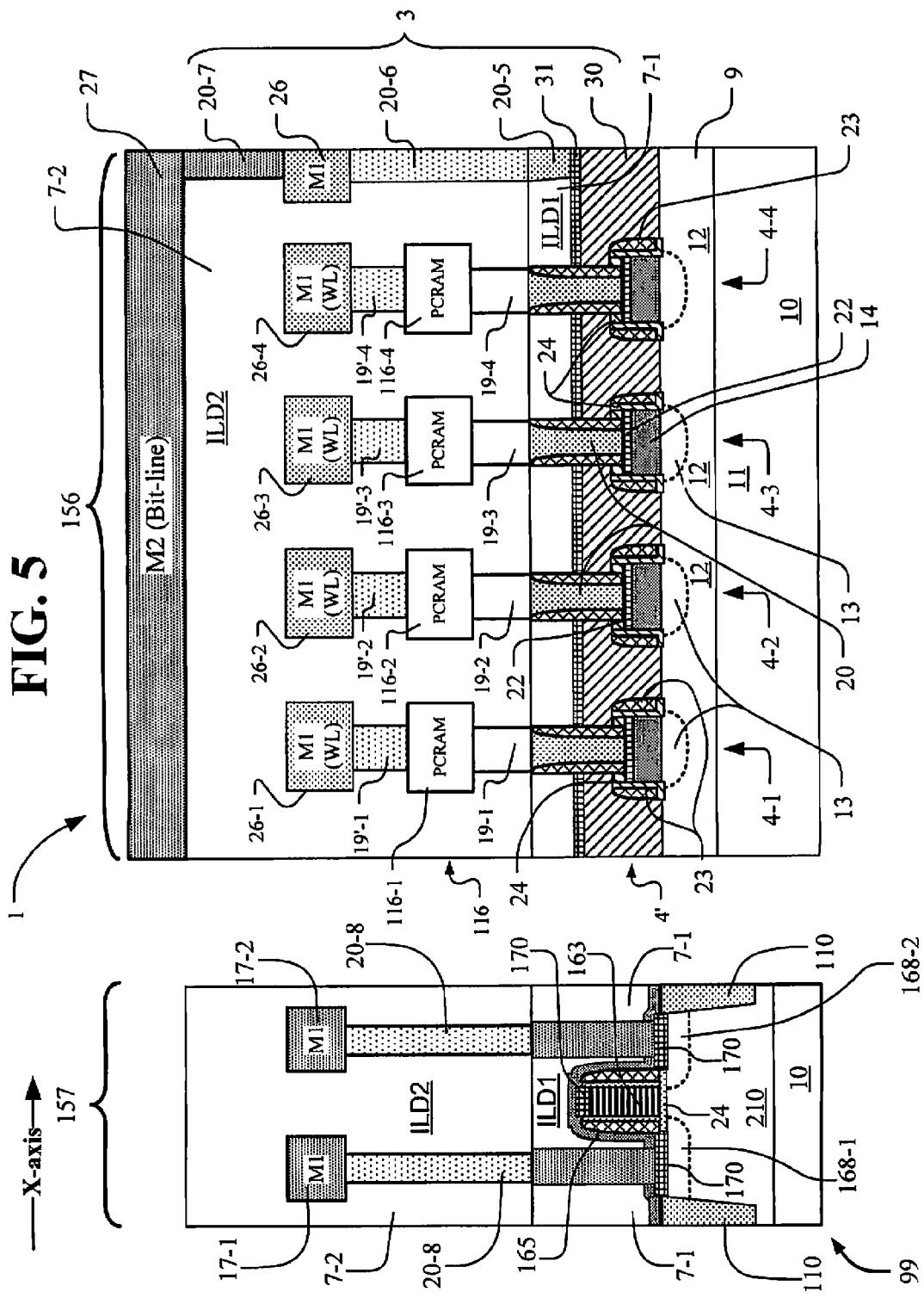
FIG. 5 depicts a cross-sectional view of an alternate embodiment for the PCM memory of FIG. 4.

FIG. 5 provides an alternate embodiment for the PCM device 1 shown in FIG. 4. The difference between FIG. 5 and FIG. 4 is that a different type of base conductor 3 is provided for contacting the base conductor 30 and contacting the electrodes of field-effect transistors 99 (for example, the source 168-1 and drain 168-2).

In FIG. 5, each PCRAM 116 is connected to a M1 word line 26 through a general contact 19'. Specifically, the PCRAMs 116-1, 116-2, 116-3 and 116-4 are connected to word lines 26-1, 26-2, 26-3 and 26-4 through general contacts 19-1, 19-2, 19-3 and 19-4, respectively. Alternately, PCRAMs 116 on one line can be designed to connect to a line trace (not shown) running vertical to plane of the drawing. Such PCRAM line trace can be connected to the M1 word line through the general contacts of the FIG. 4 type. Typically, general contacts for such type of line trace can be placed in a region of the device 1 where the rules for contact spacing are more relaxed.

In FIG. 6 and FIG. 6A, semiconductor structures are shown for commencing the arranging of string arrays and PCM memories in embodiments of the present specification. In memory region 156, a conductive region of the first conductivity type (p-type) is arranged in substrate 10 forming a collector region 11 (See FIG. 6A). The conductive region functions as a collector electrode and can be formed in a well region or in a semiconductor substrate of identical conductivity. In non-memory region 157, a first isolation 110 is arranged by conventional Shallow Trench Isolation (STI) or other formation techniques. The isolation 110 is followed by forming a thin oxide layer 160 (see FIG. 6A).

In connection with FIG. 6 and FIG. 6A, logic well 210 is arranged in non-memory area 157 by first applying photo-resist followed by an ion implantation technique to dope the well region 110 with at least one or more types of impurities.

In connection with FIG. 6 and FIG. 6A, a first diffusion 9 (base diffusion) of a second type of conductivity (n-type) in the substrate of memory area 156 is arranged by using an ion implantation technique. A photo-resist and masking step is applied prior to the ion implant to block ions from being implanted in the non-memory area 157.

In connection with FIG. 6 and FIG. 6A, the thin oxide layer in the memory area 156 is removed by conventional oxide etch. Prior to the etch, an etching mask using photo-resist and a masking step is applied to cover the non-memory area 157 and to expose the memory area 156. The etching mask is stripped after the etch.

In connection with FIG. 6 and FIG. 6A, an emitter conductor atop of substrate 10 is arranged. For example, a polysilicon layer is arranged followed by forming a tungsten silicide (WSi) layer atop of the polysilicon layer. The emitter conductor 13 is typically heavily doped by impurity of the second conductivity type. A typical doping concentration is approximately $10^{20}$ atoms/cm$^3$.

In connection with FIG. 6 and FIG. 6A, a first insulator 24 (for example, oxide) having thickness from about 10 nanometer (nm) to about 50 nm is arranged atop of the emitter conductor 13.

In connection with FIG. 6 and FIG. 6A, a photo-resist and hard mask lines 52 are arranged in the memory area 156 at minimum feature size F along a first direction (Y-axis direction). This step exposes the first insulator 39 uncovered by the hard mask lines.

In connection with FIG. 6 and FIG. 6A, the exposed first insulator 39 is removed by conventional etching technique. This step exposes the emitter conductor.

In connection with FIG. 6 and FIG. 6A, the exposed emitter conductor is removed by applying a WSi etch followed by a polysilicon etch using conventional etching technique such as reactive ion etch (RIE). The etch forms a plurality of first trenches 36 (see FIG. 6A). The etch can be continued to optionally form a micro trench having a depth from about 10 nm to about 100 nm in the substrate. The photo-resist and the hard mask is stripped after the etch.

In connection with FIG. 6 and FIG. 6A, a second insulator 24 such as oxide is arranged on the sidewall of the emitter conductor by thermal oxidation. The step also forms oxide on the exposed substrate and further out diffuses the impurity from the emitter conductor into the substrate to form the emitters 13 of bipolar junction transistors.

In connection with FIG. 6 and FIG. 6A, sidewall spacers 23 of nitride along sidewalls of the emitter conductor.

In connection with FIG. 7, FIG. 7A and FIG. 7B, a photo-resist and masking step is applied to protect the oxide in the non-memory area 157. The thin oxide on the substrate is removed with a control oxide etch to expose the substrate. This step is followed by stripping off the photo-resist.

In connection with FIG. 7, FIG. 7A and FIG. 7B, a base conductor 30 is arranged over the structure. The base conductor 30 is arranged with a planar surface, and can be formed by, for example, depositing a polysilicon layer having impurity of the second conductivity type. The impurity in the base conductor 30 can be introduced by in-situ technique. Alternately, the impurity can be introduced by ion implant at the stage after forming the base conductor 30 or more desirably in a latter stage. One such alternate embodiment is to dope the base conductor 30 using the same implant that forms source/drain diffusions 168 (see FIG. 9) of field-effect transistors 99. The doping concentration of the base conductor 30 typically ranges from about $1 \times 10^{18}$ to $1 \times 10^{21}$ atoms/cm$^3$.

In connection with FIG. 7, FIG. 7A and FIG. 7B, a thick nitride layer 37 is arranged over the base conductor 30. The thickness of the nitride layer 37 typically ranges from about 20 nm to about 80 nm.

In connection with FIG. 7, FIG. 7A and FIG. 7B, a photo-resist followed by a masking step is arranged to form a plurality of photo-resist line traces 38 along the second direction (X-axis direction) in the memory area 156. Each line trace 38 is separated from an adjacent trace 38 by a second trench 40-2. This step forms an etching mask for the subsequent etching steps. The non-memory area 157 is covered by the etching mask. The thick nitride 37 not covered by the etching mask is removed by applying a nitride etching step followed by another etching step to remove an upper portion of the base conductor 30 in the second trench 40-2. This step exposes the first insulator 39 in the second trench. The exposed first insulator 39 is removed to expose the emitter conductor 14, 22 by conventional etching technique.

In connection with FIG. 7, FIG. 7A and FIG. 7B, a plurality of emitter conductors 14, 22 are arranged by applying an etching step to remove the exposed emitter conductor layers. This step also removes the lower portion of the base conductor layers to form a plurality of base conductor 30 lines oriented along the second direction (X-axis direction). The sidewall spacers and substrate in the second trenches 40-2 are exposed to the air. The exposed sidewall spacers are removed to completely expose the substrate within each of the second trenches 40-2.

In connection with FIG. 8 and FIG. 8A, a deeper second trench is arranged by etching the exposed substrate 10 within each of the second trenches 40-2. The etch forms sidewalls and a bottom of each trench within the substrate. The final depth of the second trench 40-2 is preferred at a depth deeper than the depth of the base diffusion 9. The step forms a plurality of base diffusions and base conductor 30 lines both oriented along the second direction (X-axis direction). The photo-resist line traces and etching mask are removed. An oxide layer is arranged on the sidewalls and the bottom of each of the second trenches 40-2. The trenches are filled by a gap-filling dielectric (for example, HDP oxide). The gap-filling dielectric is polished off by using chemical-mechanical polishing (CMP) technique. The CMP process uses the thick nitride as a polishing stopper. An optional etch-back technique can be employed to clear any residue of the gap-filling dielectric on the thick nitride surface. The step forms second Shallow-Trench-Isolation (STI) regions oriented along the second direction (X-axis direction) in the structure.

In connection with FIG. 9, FIG. 9A and FIG. 9B, the thick nitride 37 of FIG. 8 and FIG. 8A is removed, for example, by employing hot phosphoric acid to etch the nitride. A photo-resist followed by a masking step is arranged to protect memory area 156. The step exposes base conductor 30 in the non-memory area 157. The exposed base conductor is etched in the non-memory area 157 followed by stripping the photo-resist. A gate insulator 56-1 for the logic field-effect transistor 99 is arranged in the non-memory area 157 by using a thermal oxidation technique. This step also forms oxide 56-1 on base conductor 30 in memory area 156.

In connection with FIG. 9, FIG. 9A and FIG. 9B, gate 163 of the logic field-effect transistor 99 is arranged. This is done, for example, by first depositing a polysilicon layer followed by applying photo-resist, a masking step and a RIE etch. Lightly-doped source 168-1/and drain 168-2 (LDD) of the logic field-effect transistor 99 are arranged. This is done by applying photo-resist and a masking step followed by ion implanting impurity in the non-memory area 157.

In connection with FIG. 9, FIG. 9A and FIG. 9B, gate 163 has sidewall spacers 23 arranged along the sidewalls of the gate 163. As an example, the spacers 23 are formed by first depositing a thin oxide layer 56-2 such as TEOS, followed by depositing a spacer nitride layer. An RIE etching on the spacer nitride layer is next performed to form the sidewall spacers 23.

Source/drain diffusions are arranged for the logic field-effect transistor 99 to form source 168-1 and drain 168-2. This arranging is done, for example, by applying photo-resist and masking steps followed by ion implanting impurity in the non-memory area 157. In an alternate embodiment, the base conductor 30 can be doped by sharing the implant forming the source/drain diffusions.

In connection with FIG. 10, FIG. 10A and FIG. 10B, the TEOS oxide 56-2 and the gate 163 insulator of FIG. 9A and FIG. 9B are removed by an oxide etch to expose the base conductor 30 in the memory area 156. This step also exposes the source 168-1 and drain 168-2 diffusions and the gate 163 of field-effect transistor 99 in the non-memory area 157. A self-aligned silicide (Salicide) 31 is arranged over the exposed base conductor 30, gate 163 and diffusions of field-effect transistors. An optional oxynitride layer with thickness ranging from about 10 nm to about 50 nm over the structure is arranged followed by depositing a first inter-layer-dielectric 43 (ILD1).

In connection with FIG. 10, FIG. 10A and FIG. 10B, a photo-resist and masking step is arranged to define a first type of contact openings. Such contact openings are formed to extend to the emitter conductor 14, 22. This step exposes the ILD1 43 in the contact mask opening area. The exposed ILD1

43 is etched until the oxynitride 42 is observed and is followed by etching the exposed oxynitride 42 to observe salicide 31 of the base conductor 30. The step is followed by etching the exposed salicide 31 and the base conductor 30 to expose the first insulator 39. The exposed first insulator 39 is etched until observing the silicide 22 (WSi) of the emitter conductor to form a plurality of contact holes 44. Although each contact hole 44 is shown centered to each emitter conductor 14, 22, typically each contact hole 44 can be off the center and can be shifted vertically or horizontally. The photo-resist and the etching mask are then stripped.

In connection with FIG. 11, FIG. 11A and FIG. 11B, a structure processed with the same steps as described in connection with FIG. 10, FIG. 10A and FIG. 10B is shown, except that contact holes 44 and contacts 20 are shifted vertically up by a distance of, for example, about half of the feature size F. Only structures in memory area 156 are shown for easy illustration. Each contact hole 44 has a portion of the bottom landing on the emitter conductor salicide 22 and the other portion of the bottom landing on the STI 41, thus insulated from the base diffusion 14.

The structure in FIG. 11, FIG. 11A and FIG. 11B is desirable as it permits a wider base conductor 30 in regions next to contact holes 44 for the salicide 31 formation. In accordance with such embodiment, as illustrated in FIG. 11B, the base conductor 30 width adjacent to a contact is shown wider than the one shown in FIG. 10, FIG. 10A and FIG. 10B.

In connection with FIG. 12, FIG. 12A and FIG. 12B, the processing continues from the structure shown in connection with FIG. 10, FIG. 10A and FIG. 10B. Contact sidewall spacers 23 of an insulator (for example, oxide, nitride, oxynitride etc) are arranged along sidewalls of each contact hole 44 in FIG. 11, FIG. 11A and FIG. 11B by using conventional sidewall spacer formation techniques. The sidewall spacers 23 typically have a width at the bottom of the contact holes in the range from about 5 nm to about 20 nm. The contact holes 44 are filled with metal (for example, tungsten) by employing, for example, LPCVD techniques. The step forms contacts 20 for contacting the emitter conductor salicide 22. The structure can be further processed to integrate PCRAM 116 and a terminal 19-1 (not shown, see FIG. 5) through one of the contacts 20 to the emitter conductor salicide 22.

In connection with FIG. 13, FIG. 13A and FIG. 13B, a second inter-layer-dielectric 7-2 (ILD2) (not shown) can be deposited (see FIG. 4 and FIG. 5). A photo-resist and masking step define a second type of contact hole 44' in each of the base conductor 30 lines to be filled with metal 20'. Such contact holes 44' are also formed in the source 168-1/drain 168-2 diffusions, the gate 163 area of field-effect transistors, and in other memory area 156, for example, in a PCM strapping area (not shown). This step exposes the inter-layer dielectric (ILD2) in the contact mask opening area. The exposed inter-layer dielectric ILD2 until the ILD1 is observed. The etch is continued to remove the exposed ILD1 until the oxynitride 42 is observed. The etch is followed by etching the exposed oxynitride 42 to observe the salicide 31 of the base conductor 30, salicides of diffusions 168 and gate 163 of field-effect transistor 99. The photo-resist and the etching mask are stripped followed by forming metal 20' (for example, tungsten) to fill the contact holes 44'. The step forms general contacts 20' in both the memory area 156 and non-memory area 157. The structure can be further processed to form metal layers to integrate PCRAM with one terminal of the PCRAM connected to one of the emitter conductor and the other terminal connected to a word line metal (for example, M1 or M2) to result in structures like those shown in FIG. 4 and FIG. 5.

An alternate method of arranging semiconductor structures is described in connection with FIG. 14 and FIG. 14A and FIG. 14B to form string arrays and PCM memories according to embodiments of the present specification. A two-poly-based process flow is described where the base conductor 30 is shared with the gate 163 (see FIG. 15) of logic field-effect transistor 99 in the process of being formed. The process starts with the structure in FIG. 6 and FIG. 6A. Optionally remove the second insulator 24 (in both the non-memory area 157 and memory area 156) followed by reforming the second insulator 24 by conventional means such as thermal oxidation. This step fixes the damages incurred to the second insulator 24 during the sidewall spacers 23 formation and can be avoided if negligible damage and/or negligible defects are introduced to the second insulator 24. This step can be followed by an optional step forming a thin polysilicon layer (not shown) over the second insulator 24. A photo-resist and masking step is applied to protect the non-memory area 157. The optional formed thin polysilicon layer (not shown) is removed followed by removing the second insulator 24 in the memory area 156 with conventional etch to expose the substrate 10. This step is followed by stripping off the photo-resist.

Figure 14:
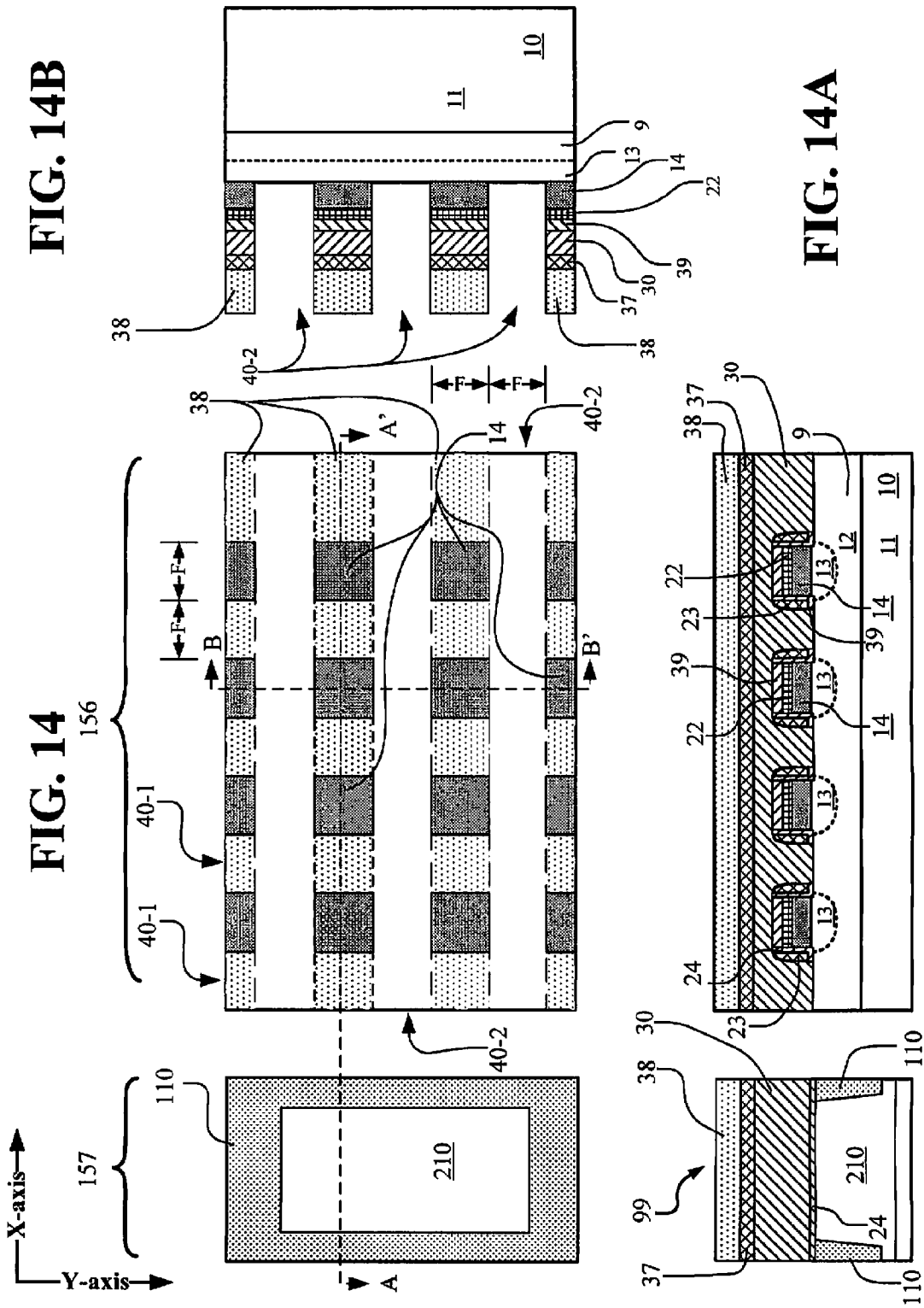

In connection with FIG. 14 and FIG. 14A and FIG. 14B, a base conductor 30 is arranged over the structure. The base conductor 30 thus formed contacts the base diffusion 9 in the memory area 156 and is insulated from the logic well 210 in the non-memory area 157. The base conductor 30 is with a planar surface, and can be formed by for example depositing a polysilicon layer having impurity of the second conductivity type. The impurity in the base conductor 30 can be introduced by in-situ technique. Alternately, the impurity can be introduced by ion implant at the stage after forming the base conductor 30 or more desirably in a latter stage. One such alternate embodiment is to dope the base conductor 30 using the same implant that forms source 168-1/drain 168-2 diffusions of field-effect transistor 99 (see FIG. 16). The doping concentration of the base conductor 30 typically ranges from about $1 \times 10^{18}$ to $1 \times 10^{21}$ atoms/cm$^3$.

In connection with FIG. 14 and FIG. 14A and FIG. 14B, a thick nitride layer 37 is arranged over the base conductor 30. The thickness of the nitride typically ranges from 20 nm to 80 nm. A photo-resist 38 followed by a masking step arranges a plurality of photo-resist line traces along the second direction (X-axis direction) in the memory area 156. Each line trace is separated from an adjacent trace by a second trench 42. This step forms an etching mask for the subsequent etching steps. The non-memory area 157 is covered by the etching mask. The thick nitride 37 not covered by the etching mask is removed by applying a nitride etching step followed by another etching step to remove an upper portion of the base conductor 30 in the second trench 40-2. This step exposes the first insulator 39 in the second trench 42. The exposed first insulator 39 is removed to expose the emitter conductor salicide 22 by conventional etching techniques.

In connection with FIG. 14 and FIG. 14A and FIG. 14B, a plurality of emitter conductors 13 are arranged by applying an etching step to remove the exposed emitter conductor 22, 14. This step also removes the lower portion of the base conductor 30 to form a plurality of base conductor 30 lines oriented along the second direction (X-axis direction). The sidewall spacers 23 and substrate 10 in the second trenches 40-2 are exposed to the air. The exposed sidewall spacers 23 are removed to completely expose the substrate within each of the second trenches 40-2.

In connection with FIG. 15 and FIG. 15A and FIG. 15B, the structure of FIG. 14 and FIG. 14A and FIG. 14B is further processed by following steps described in connection with FIG. 8, FIG. 8A, and FIG. 8B to form STI 41 in the memory area 156. The gate 163 of field-effect transistor 99 in the non-memory area 156. This can be done by applying photo-resist and a masking step to define patterns for the gate 163 of field-effect transistor 99. This step exposes a portion of the thick nitride 37 in the non-memory area 157. The photo-resist patterns thus defined form an etching mask, which protects the memory area 156.

Figure 15:
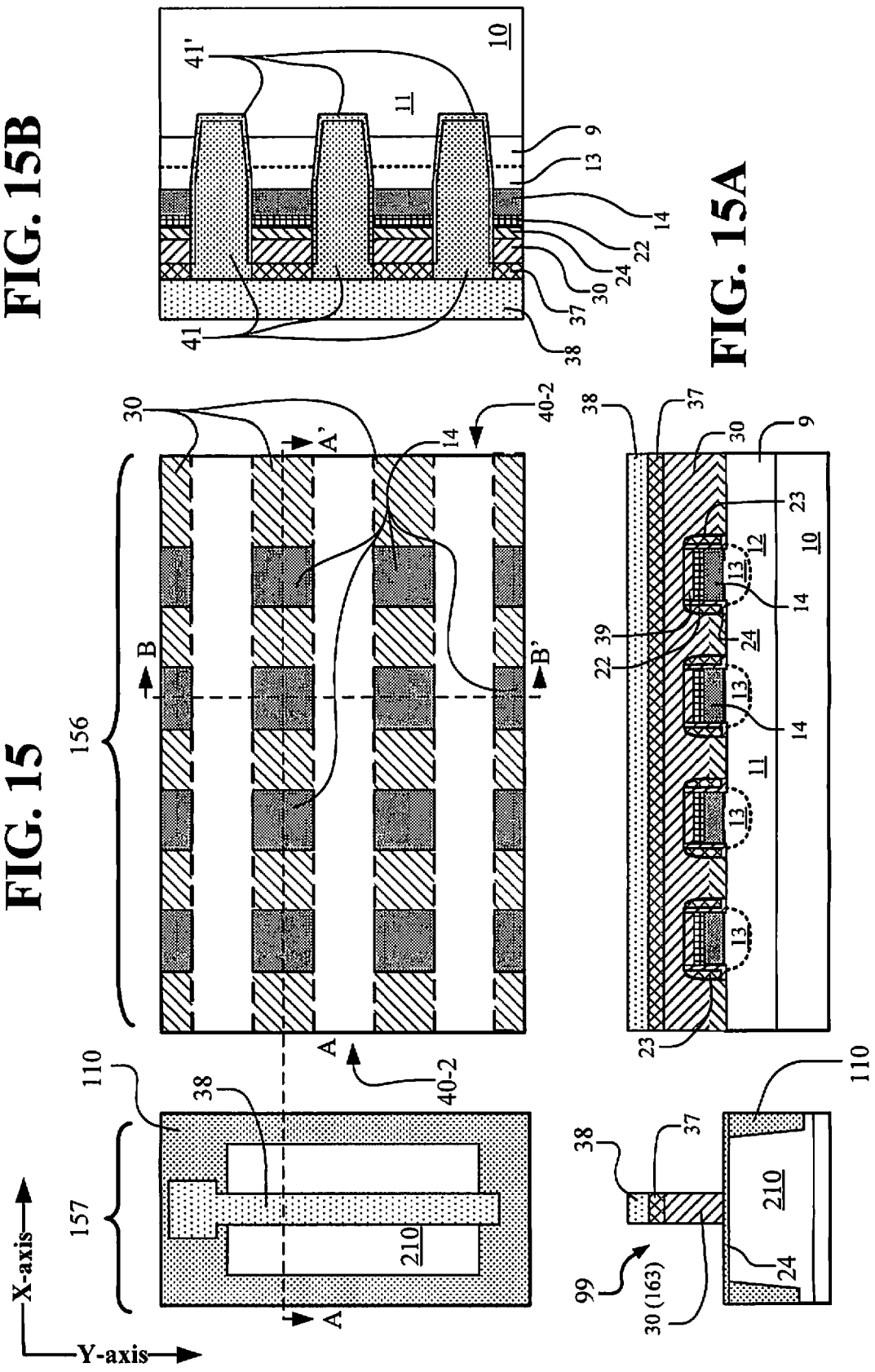

In connection with FIG. 15 and FIG. 15A and FIG. 15B, the exposed thick nitride 37 is removed followed by removing the underlying base conductor 30 using conventional RIE etch until the second insulator 24 in the non-memory area 157 is observed. This step forms gate 163 of field-effect transistor 99 using the base conductor 30 in the non-memory area 157. The memory area 156 including emitter conductor and base conductor 30 are protected by the etching mask, and the etch has no effect in these conductors.

Figure 16:
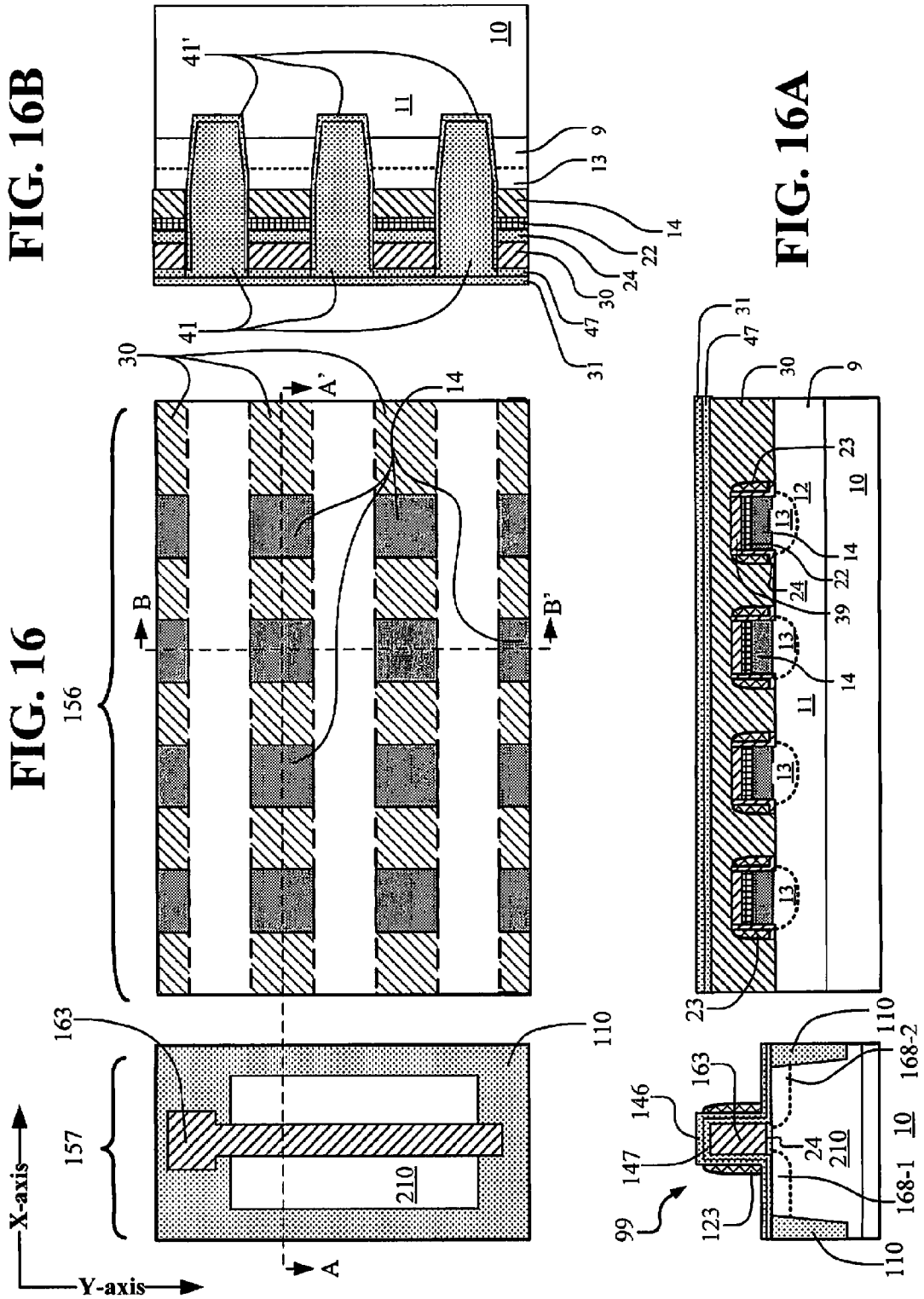

In connection with FIG. 16 and FIG. 16A and FIG. 16B, the etching mask is stripped followed by removing the thick nitride 37 in both memory area 156 and non-memory area 157. The nitride 37 can be removed by, for example, employing hot phosphoric acid. A third insulator 147 is arranged encapsulating the gate 163 by using thermal oxidation techniques. This step also forms oxide 147 on the base conductor 30 in memory area 156. Lightly-doped source 168-1/drain 168-2 (LDD) are arrange for the logic field-effect transistor 99. This step is done, for example, by applying photo-resist and a masking step followed by ion implanting impurity in the non-memory area 157.

In connection with FIG. 16 and FIG. 16A and FIG. 16B, gate 163 has sidewall spacers 123 along sidewalls of the gate 163. As an example, the spacers 163 are formed by first depositing an optional thin oxide layer 146 such as TEOS, followed by depositing a spacer nitride layer. An RIE etch on the spacer nitride layer is next performed to form the spacers 123. Source 168-1/drain 168-2 diffusions are arranged for the logic field-effect transistor 99. This can be done by applying photo-resist and masking steps followed by ion implanting impurities in the non-memory area 157. In an alternate embodiment, the base conductor 30 can be doped by sharing the implant forming the source 168-1/drain 168-2 diffusions. This can be done while considering the type of conductivity for the base conductor 30. For example, if the base conductor 30 is intended to be a n-type conductivity, then the source 168-1/drain 168-2 implant forming the n-channel field-effect transistors can be employed and shared for doping the base conductor 30.

The structures of FIG. 16 and FIG. 16A and FIG. 16B are further processed using steps described in connection with FIG. 10 through FIG. 13 and result in structures a shown in FIG. 4 and FIG. 5.

Figure 17:
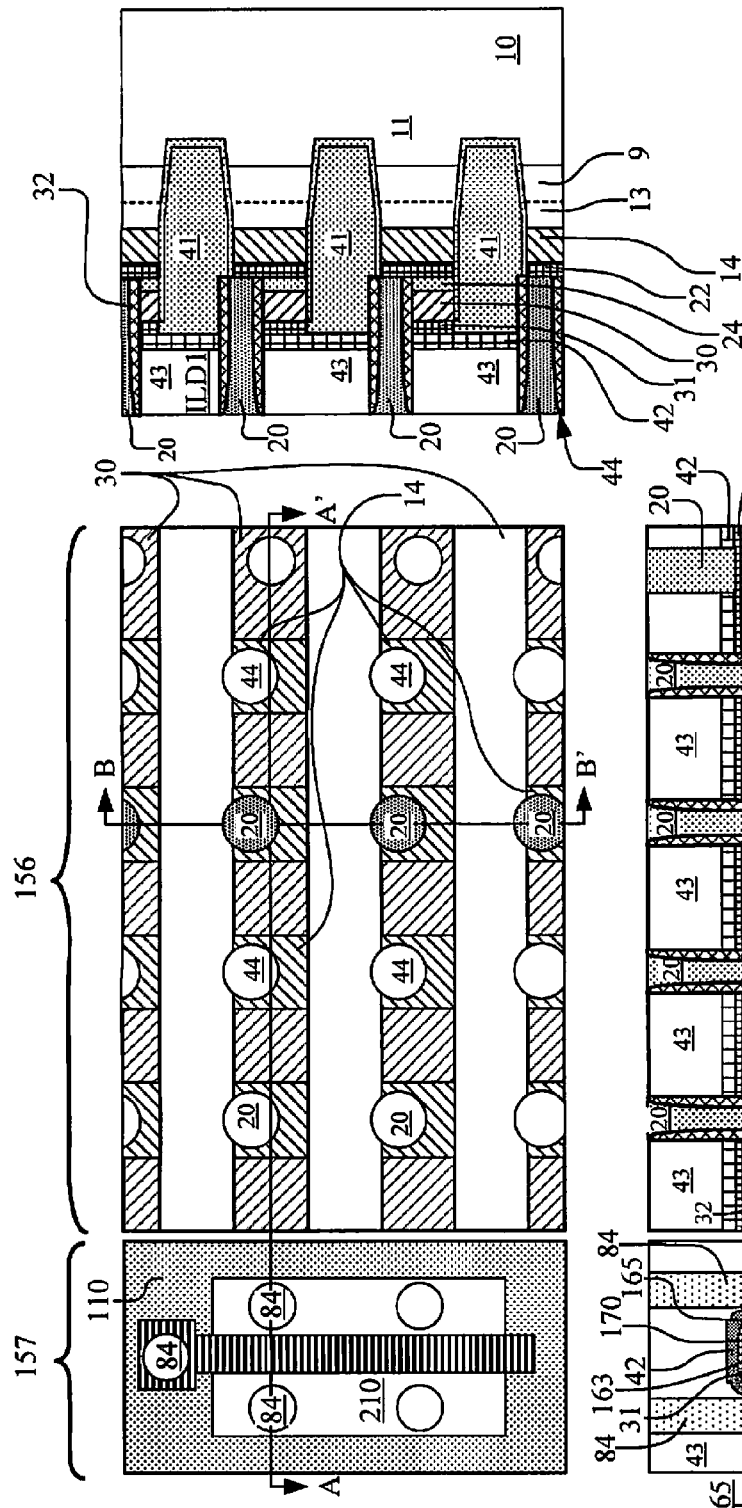

FIG. 17 and FIG. 17A and FIG. 17B depict a similar structure to that shown in FIG. 13, FIG. 13A and FIG. 13B but with the contacts 20 shifted in the same manner as the contact holes 44 are shifted as described in connection with FIG. 11, FIG. 11A, and FIG. 11B.

The FIG. 17 and FIG. 17A and FIG. 17B structure can be further processed to form metal layers to integrate PCRAM with one terminal of the PCRAM connected to one of the emitter conductor and the other terminal connected to a word line metal (for example, M1 or M2) to result in structures shown in FIG. 4 and FIG. 5.

Figure 18:
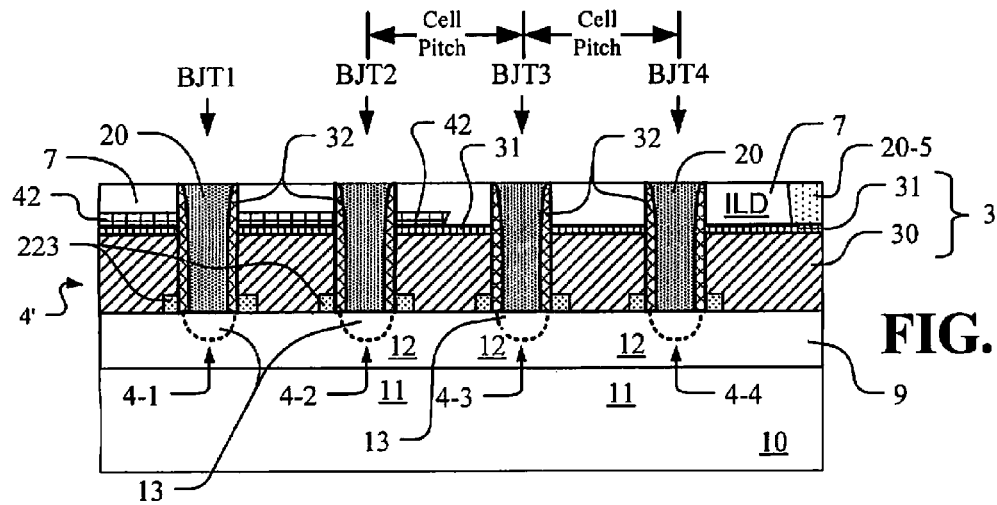
FIG. 18 depicts an alternate embodiment of bipolar junction transistor (BJT) string.

In FIG. 18, an alternate embodiment of bipolar junction transistor (BJT) string 4' is shown. In FIG. 18, each of the transistors 4 including transistors 4-1, 4-2, 4-3 and 4-4 includes a common collector region 11, a common base region 9 and a plurality of emitters 13, one emitter for each of the bipolar junction transistors 4. The bases 12 for the transistors 4 are part of a single common base region 9 for the string array 4' of transistors 4-1, 4-2, 4-3 and 4-4. The common base region 9 connects to and electrically couples a base contact 3 for the plurality of bipolar junction transistors 4. The base conductor 3 is formed of one or more good conductors, for example, a base salicide 31 and a base poly 31. The base conductor 3 and in the embodiment shown, the base salicide 31, are in contact with the base contact 20-5. The base contact 20-5 is common for all the bases 12 of the transistors 4-1, 4-2, 4-3 and 4-4.

In FIG. 18, the transistors 4-1, 4-2, 4-3 and 4-4 are arrayed at the cell pitch. The cell pitch in FIG. 18 is established by the element spacing of the transistors 4-1, 4-2, 4-3 and 4-4 and does not have interspersed contacts such as the contacts 3-1 and 3-2 of FIG. 1. The single base contact 3 connects to region 9 and hence to the bases 12 for each of the plurality of bipolar junction transistors 4-1, 4-2, 4-3 and 4-4.

In FIG. 18, the emitters 13 and the collector region 11 are arranged with a first type of conductivity (for example, p-type), and the base region 9 is with a second type of conductivity (for example, n-type). The collector of each of the transistors 4-1, 4-2, 4-3 and 4-4 is part of the common collector region 11. The base 12 of each of the transistors 4-1, 4-2, 4-3 and 4-4 is part of the common base diffusion region 9.

In FIG. 18, each emitter 13 is contacted by an emitter contact 20. The emitter contacts 20 and the base contact 20-5 are typically formed of metal, such as tungsten (W), aluminum (Al), Copper (Cu) by way of example. The salicides 22 reduce parasitic resistance and contact resistance. An insulator 24 surrounds the poly emitters 14 and in the embodiment of FIG. 18 additionally includes sidewall spacers 32 that are good insulators such as nitrides. An interlayer dielectric (ILD) 7 surrounds the sidewall insulators 32. Optionally, FIG. 18 includes an oxynitride layer 42 above the salicide 31.

In FIG. 18, the base conductor 30 is provided as a inter-connect connecting the base 12 of each bipolar junction transistor in one electrode. The base conductor 30 is disposed over and contacting the base diffusion 9, and in one embodiment comprises a polysilicon. The base conductor 30 is insulated from the emitter 13. Typically, the base conductor 30 is silicided by providing metal silicide 31 (for example, TiSi, CoSi, PtSi, NiSi etc) atop of the polysilicon 30. A base contact 20-5 typically comprising a metal (for example, tungsten (W), aluminum (Al), Copper (Cu) etc) is provided to make connection to the base conductor 3. The silicided base conductor 3 is preferable and provides advantages on reducing the parasitic resistance between base 12 of each bipolar junction transistor 4 and the base contact 20-5. The silicided base 3 further provides the advantage on reducing the contact resistance of the bases 12.

In FIG. 18, each emitter 13 is contacted by an emitter contact 20 typically formed of metal, for example, W, Al, Cu etc. The emitter 13 of the bipolar junction transistor is typically self-aligned to the emitter contact 20. Also, the emitter 13 is self-aligned to an emitter insulator 223. Typically, the emitter insulator 223 is formed to have a width wider than that of the emitter 13. In a preferred embodiment, the emitter insulator 223 comprises an oxide, or any other suitable insulating material. The emitter insulator 223 need not be a single layer but can be provided in more than one layer of dielectric.

In FIG. 18, each base contact 20 of one bipolar junction transistor 4 is insulated from the emitter contact 20 of another adjacent bipolar junction transistor 4 by a first inter-layer-dielectric 7 (ILD1). Further, each emitter contact 20 is insulated from the base conductor 3 by contact sidewall spacers 32, which typically are an insulator such as nitride, oxide, oxynitride etc. Each contact 20 is typically connected to a metal line through which proper voltage is applied to operate the bipolar junction transistor (see FIG. 20).

The structure in FIG. 18 provides a unique advantage that the plurality of bipolar junction transistors 4 share a common base contact 12, thus minimizing area occupied by overhead taken by interspersed contacts such as the contacts 3-1 and 3-2 of FIG. 1. Such advantage is important as it permits bipolar junction transistors constructed in large array density (for example, giga scale density).

Figure 18A:
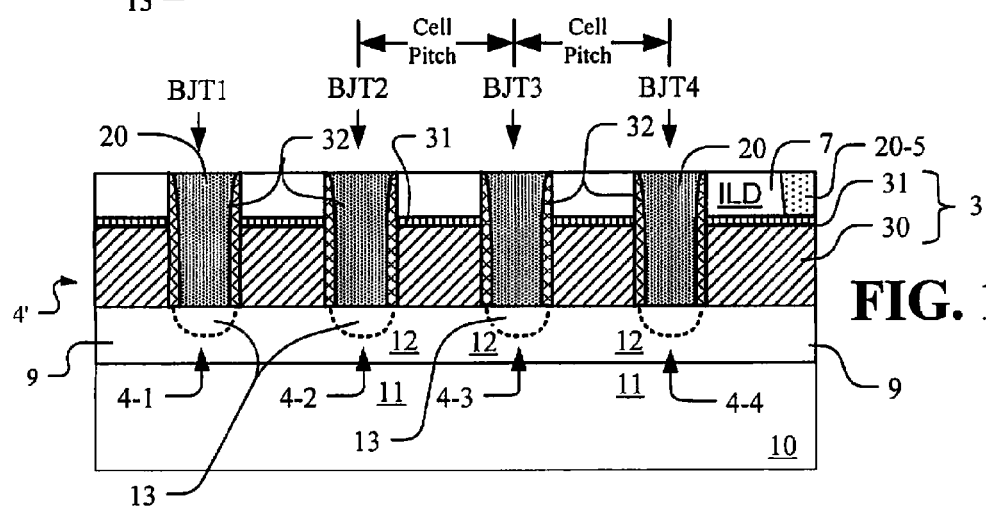
FIG. 18A depicts an alternate embodiment of bipolar junction transistor (BJT) string of FIG. 18.

FIG. 18A provides an alternate embodiment of the string 4' of bipolar junction transistors 4 shown in FIG. 18. The difference between the structures in FIG. 18 and FIG. 18A is that the emitter insulator 223 in FIG. 18 is removed in FIG. 18A. Further, each of the edges of the emitter junctions 13 of each bipolar junction transistor 4 is shown located under the contact sidewall spacers 32. The structure in FIG. 18A is simpler and has the advantages on less manufacturing steps then the structure in FIG. 18.

Figure 18B:
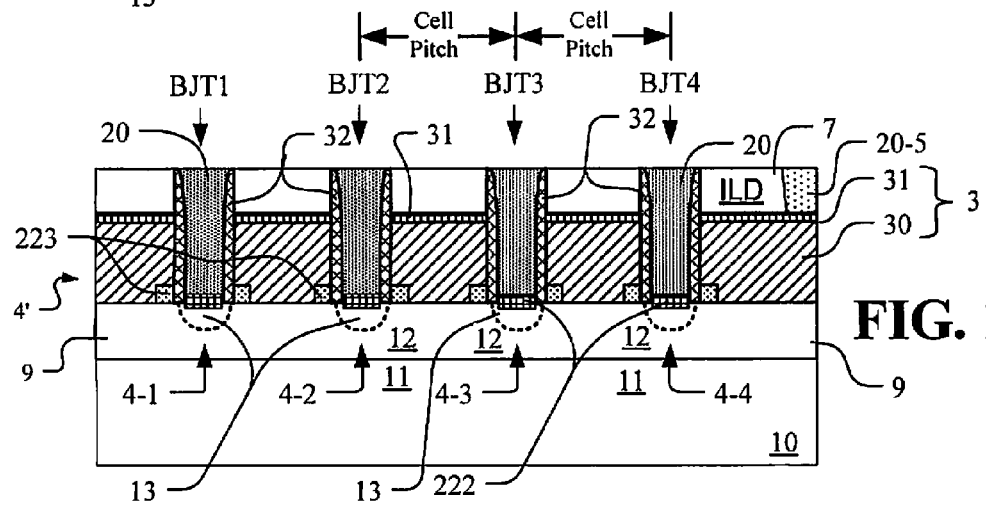
FIG. 18B depicts an alternate embodiment of bipolar junction transistor (BJT) string of FIG. 18.

FIG. 18B depicts an alternate embodiment of bipolar junction transistor (BJT) string 4' of FIG. 18. The difference between the structures in FIG. 18 and FIG. 18B is that a silicide region 222 is provided in the emitter 13 in FIG. 18B in contact with the emitter contact 20. Such silicide region 222 is typically self-aligned to the contact 20.

The structures in FIG. 18, FIG. 18A and FIG. 18B can be implemented in a high density of bipolar junction transistor arrays 4' with bipolar junction transistors 4 arranged in rows and columns.

Figure 19C:
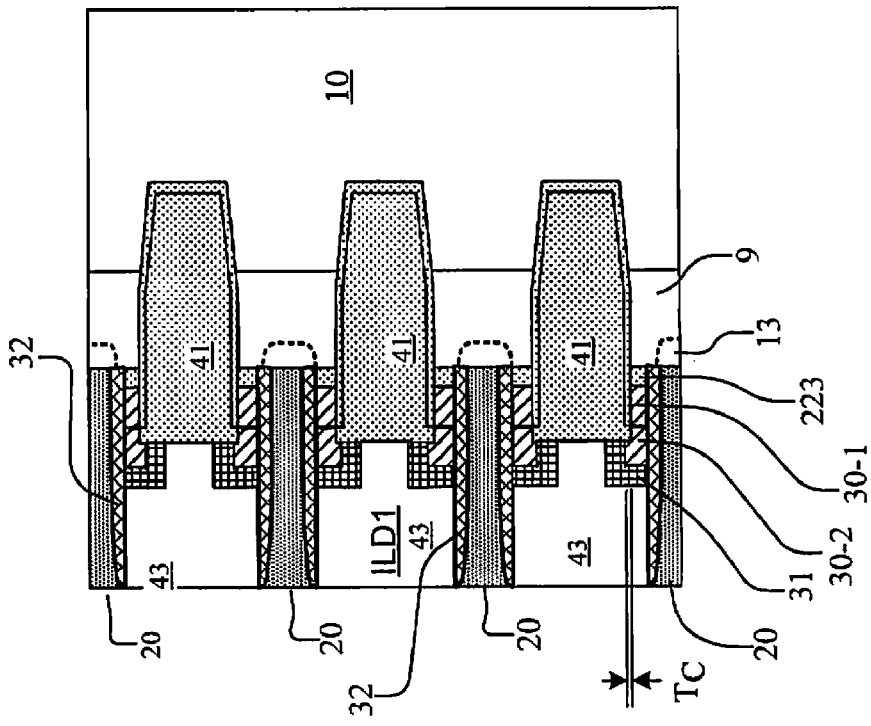
Figure 19D:
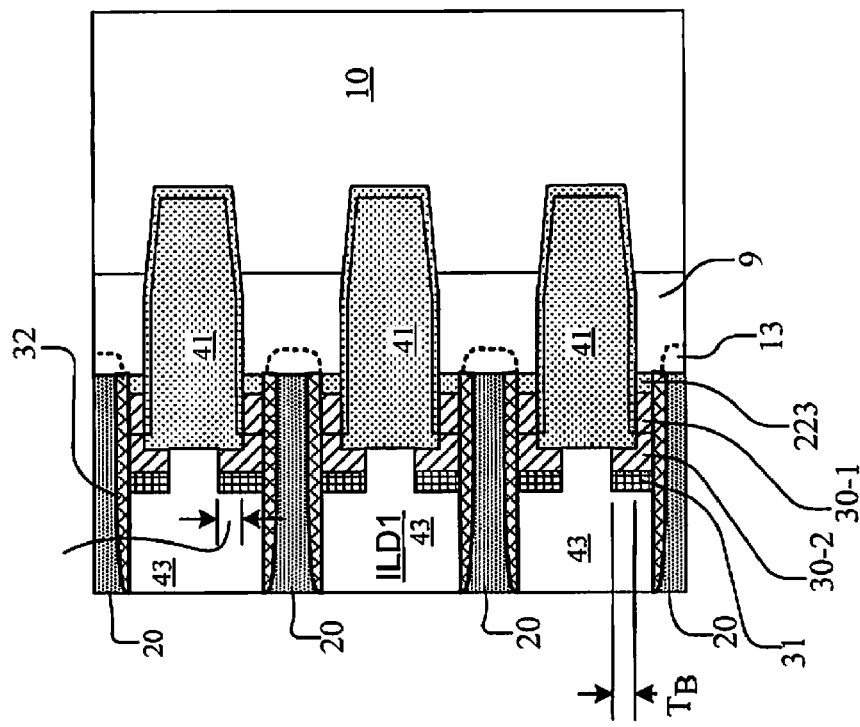

FIG. 19 depicts a top view and FIG. 19B, FIG. 19C and FIG. 19D depict cross-sectional views along section lines of the semiconductor device of FIG. 19. FIG. 19A (NS) is not shown since cross sections along section line AA' of FIG. 19 appear as FIG. 18 or optionally as FIG. 18A or FIG. 18B.

FIG. 19 provides a top view for the structure of such array in accordance with the present specification. There are four strings shown in the figure, for example a string along line AA'. Each string comprises a base conductor 3 line contacting the base diffusion. Each emitter connects to a contact. Each base conductor line 30 is shown connected to a contact 20 and in general can be connected to one or more contacts 20.

FIG. 19B provides a cross-sectional view for one embodiment along cut-line BB' for the structure shown in FIG. 19.

FIG. 19C provides a cross-sectional view on a structure along cut-line BB' for another embodiment of the structure shown in FIG. 19.

The difference between the structure in FIG. 19C and the structure in FIG. 19B is with the base conductor 30 architecture. In FIG. 19C, the base conductor 30 comprises two layers of conductors, namely conductor 30-1 and conductor 30-2, in addition to the base silicide layer 31. As illustrated, the base conductor 30 need not be one layer but can be more than one layer of conductors. Similarly, the emitter conductor 20 need not be one layer but can be more than one layer of conductors.

The method of manufacturing is exemplary and can be extended to include other embodiments of the present specification such as one provided in FIG. 19C. For example, after removing the thick nitride in the structure in FIG. 18, an additional conductor (that is, conductor 30-2) can be formed on top of the conductor 30-1 followed by a masking step defining an etching mask to define the region of the conductor 30-2 such that the conductor 30-2 is wider than the width of conductor 30-1 by an offset $T_B$.

FIG. 19D provides another embodiment for the present specification. The difference between FIG. 19C and FIG. 19D is on the silicide architecture for the base conductor 30. The conductor 30-2 is wider than the width of conductor 30-1 by an offset $T_c$. In FIG. 19D, the silicide 31 covers both the top surface and the sidewall (or edge) of the base conductor 30-2.

The architecture and offset provided in both FIG. 19C and FIG. 19D are desirable for nanometer geometry structures as it permits a wider region in the base conductor 30 for forming the base silicide 31.

Figure 20:
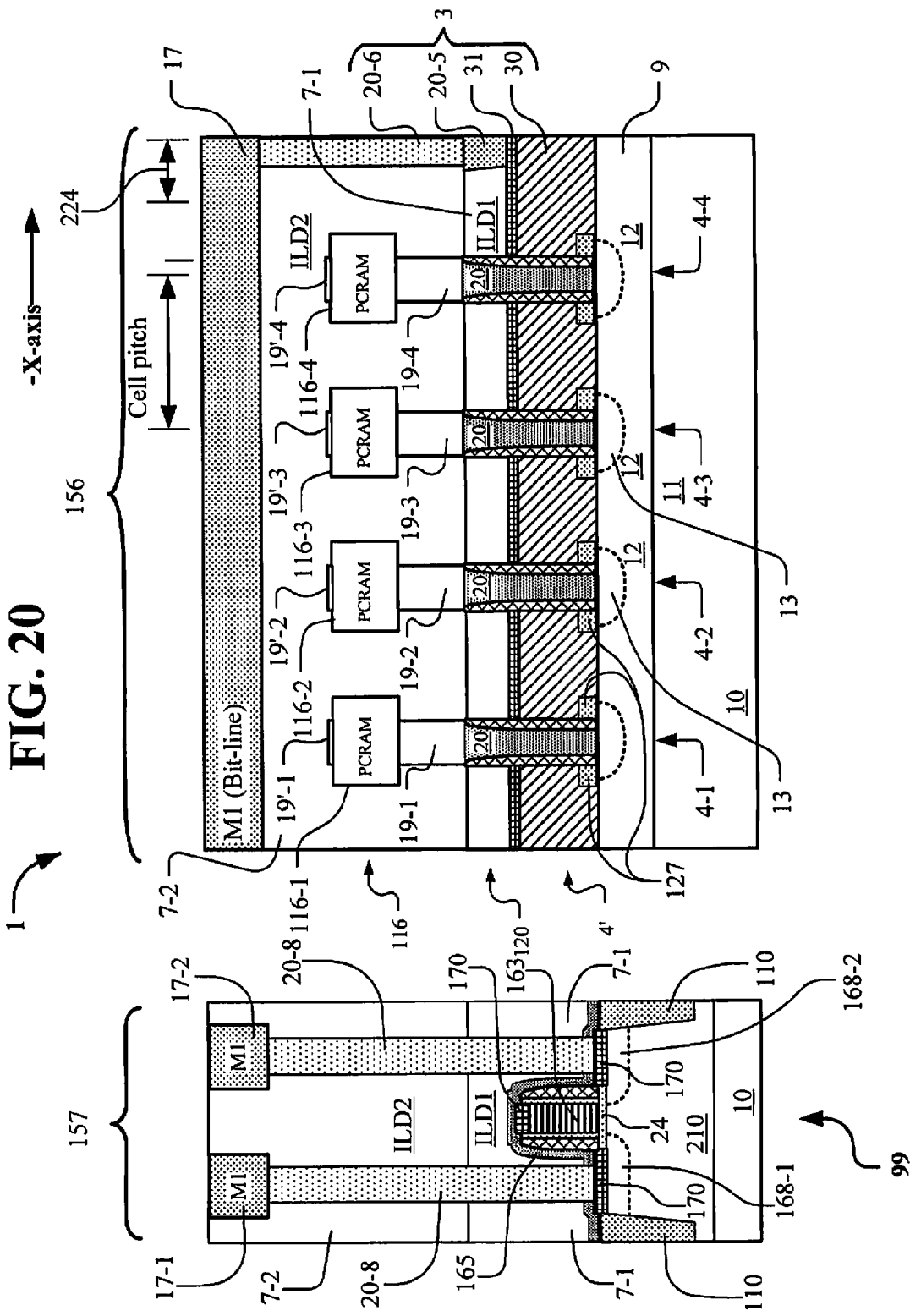
FIG. 20 depicts an embodiment of a semiconductor device formed of a string array of the FIG. 18 types with PCRAM memory and having non-memory area and memory area.

FIG. 20 provides a Phase-Change Random-Access-Memory 1 (PCRAM) having non-memory area 157 and memory area 156. A string of bit cells is arranged with a bipolar junction transistor string 4' of the FIG. 18 type in the memory area 156. The string 4' of bipolar junction transistors 4, including transistors 4-1, 4-2, 4-3 and 4-4, is combined with a plurality of PCRAMs 116, including PCRAMs 116-1, 116-2, 116-3 and 116-4, respectively. Each PCRAM cell comprises a PCRAM 116 connected to a bipolar junction transistor 4 of the FIG. 18 type. The non-memory area 157 comprises one or more logic CMOS field-effect transistors (FETs) each having a gate 163, a drain 168-2, and a source 168-1 in a logic well 210.

In FIG. 20, each PCRAM 116 is a two terminal device, having one terminal 19 connected to the emitter 13 of one bipolar junction transistor 4 through an emitter contact 20 and the other terminal 19' connected to a word line metal at metal 2 (M2) level (not shown). The word line metal is typically running along the direction vertical to the plane of the drawing. The word line metal is connected to the PCRAM through any conventional strapping method. Each PCRAM 116 is isolated from an adjacent PCRAM 116 on the same string by an insulator, for example, inter-layer dielectric 7-2 (ILD2).

In FIG. 20, the string architecture for the memory of FIG. 20 has a base strapping cell 224 for connection to the common bases 12. In the base strapping cell 224, the base contact 3 is connected to a bit-line 17 formed at metal 1 (M1) through a general contact 20-6. The base contact 3 further includes the general contact 20-6 that connects to base contact 20-5, that connects to the base silicide 31, and that connects to the base conductor 30. Typically, the bit-line 17 is arranged to run along the string direction (X-axis direction), and each string, such as string 4', can comprises 4, 8, 16 cells or more. The general contacts 20-8 are used for contacting metal 1, and particularly metal M1 17-1 and 17-2 connect to the source 168-1 and drain 168-2 of field-effect transistor 99.

In FIG. 20, the base conductor 30 significantly lowers the base parasitic resistance (100 to 500 times lower is typical). The advantage on a lower parasitic resistance permits bipolar junction transistors constructed in a string form to minimize overhead in cell area. As shown in FIG. 20, the cell pitch is half of that for the prior art cell in FIG. 1.

Figure 21:
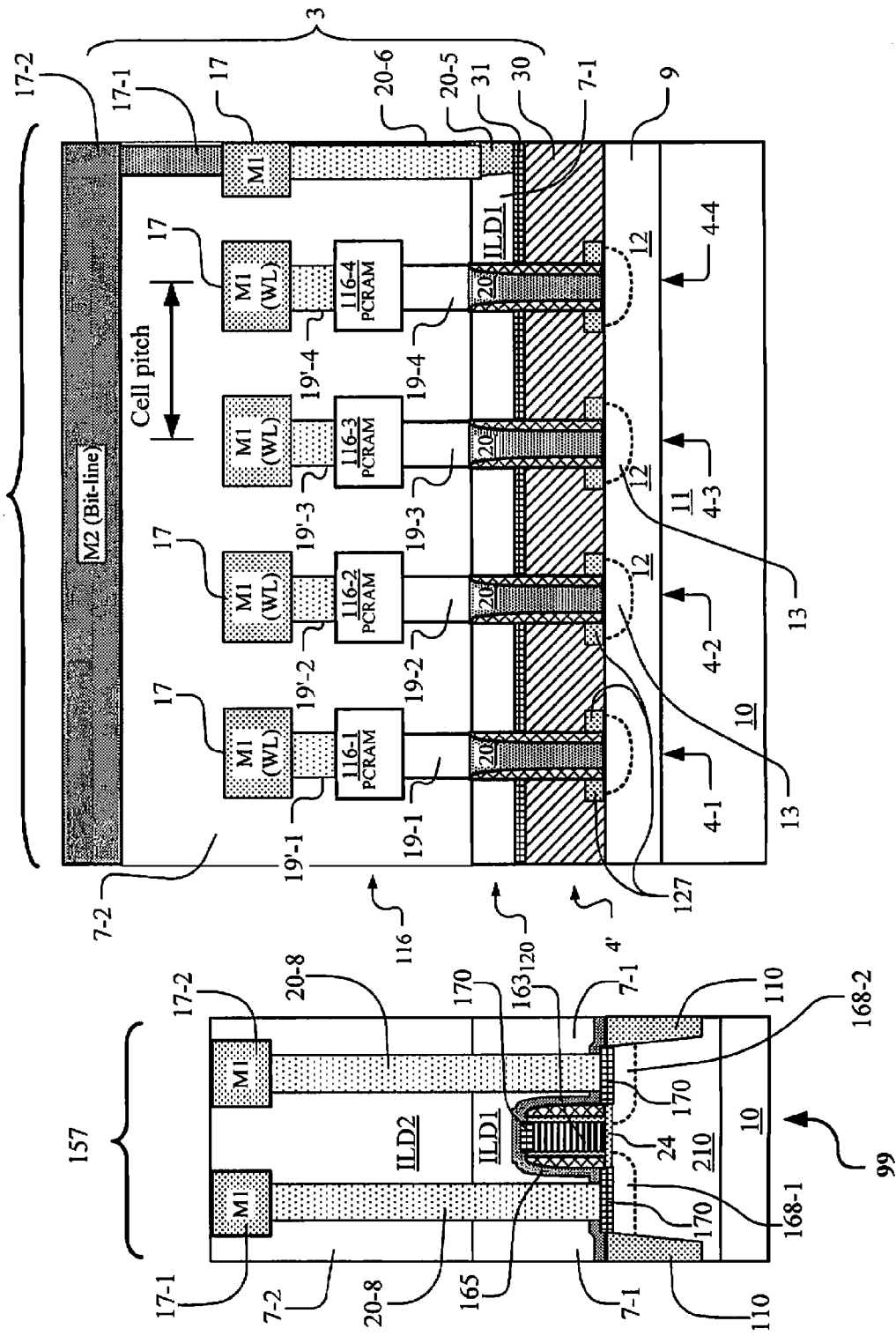
FIG. 21 depicts an alternate embodiment of a semiconductor device formed of string arrays of the FIG. 18 types with PCRAM memory and having non-memory area and memory area.

FIG. 21 provides an alternate embodiment for the PCM 1 shown in FIG. 20. The difference between the structures of FIG. 21 and FIG. 20 is that a different type of base contact 3 is provided in FIG. 21 for contacting the base conductor 30 and a different contact is provided for the electrodes of field-effect transistor 99. The base contact 3 in FIG. 21 includes the general contact 20-6 that connects to base contact 20-5, that connects to the base silicide 31, and that connects to the base conductor 30. Additionally, the base contact 3 includes the M1 metal 17 and a VIA1 connection 17-1 connecting to the M2 metal 17-2.

In FIG. 21, each PCRAM cell is shown connected to a M1 word line 17 through a general contact 19'. Alternately, PCRAM cells on one line can be designed to connect to a line trace running vertical to the plane of the drawing. Such PCRAM line trace can be connected to M1 word line through the general contacts of the FIG. 20 type. Typically, general contacts for such type of line trace can be placed in a location on the device 1 having more relaxed contact spacing requirements.

Figure 22:
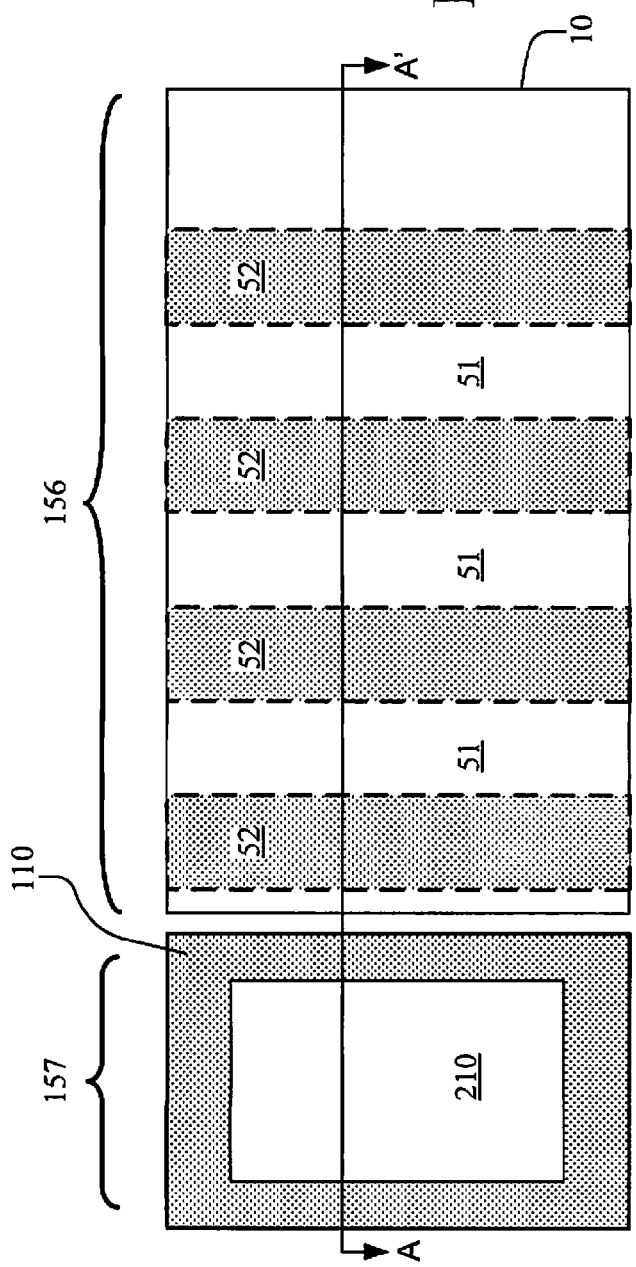
FIG. 22 and FIG. 22A depict semiconductor materials and steps for arranging string arrays and PCM memories in embodiments of the present specification.
Figure 22A:
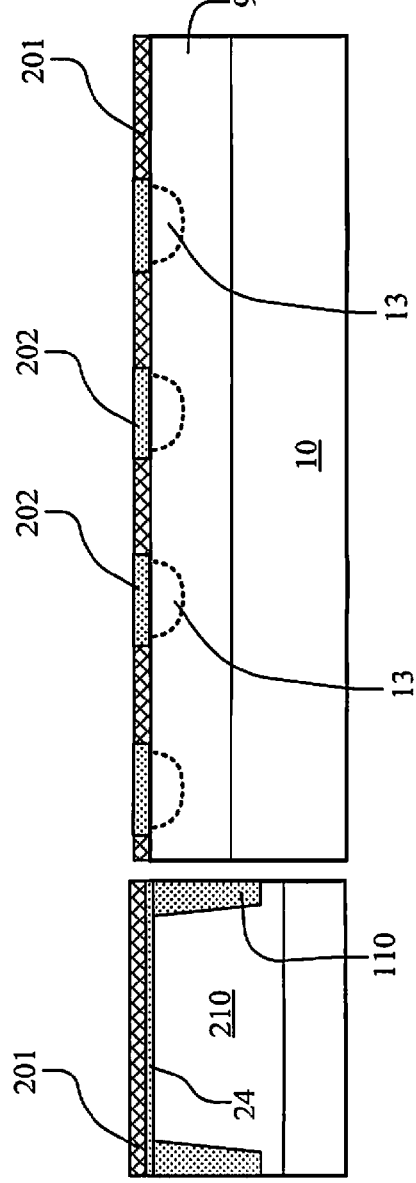

FIG. 22 and FIG. 22A depict semiconductor materials and steps for arranging string arrays and PCM memories in embodiments of the present specification. The manufacturing method starts with a conductive region of the first conductivity type (p-type). The conductive region functions as a collector electrode and can be formed in a well region 210 or a semiconductor substrate 10 of identical conductivity.

In connection with FIG. 22 and FIG. 22A, an isolation such as Shallow Trench Isolation (STI) 110 is arranged in the logic area, that is, non-memory area 157, by conventional STI formation technique followed by arranging a thin oxide layer 24. This step forms the first STI regions 110. A logic well 210 is arranged in non-memory area 157 by first applying photo-resist followed by an ion implantation technique to dope the well region 210 with at least one or more types of impurities. A first diffusion (base diffusion) of a second type conductivity (n-type) is arranged in the substrate 10 of memory area 156 by using ion implantation technique. A photo-resist and masking step is applied prior to the ion implant to block ions from implanted in the non-memory area 157. The thin oxide layer 24 is removed in the memory area 156 by conventional oxide etch. Prior to the etch, an etching mask using a photo-resist and masking step is applied to cover the non-memory area 157 and to expose the memory area 156. The photo-resist forming the base diffusion can be employed instead as the etching mask. The etching mask is stripped after the etch.

In connection with FIG. 22 and FIG. 22A, emitters 13 are arranged in the substrate with emitter insulators 202 atop of the emitters 13 and with a first insulator 201 over the thin oxide 24 in the non-memory area 157 and adjacent the emitter insulators 202. Typically, each emitter insulator 202 is formed to have a width wider than that of the underlying emitter. Further, the emitter 13 is desirably formed to be self-aligned to the emitter insulator. This self alignment can be done, for example, by first forming a first insulator (for example, nitride) having thickness of about 10 nanometer (nm) to 50 nm atop of the substrate. The step is followed by forming photo-resist lines at minimum feature size F along a first direction (Y-axis direction) in the memory area 156. This step exposes the first insulator uncovered by the photo-resist mask lines. The exposed first insulator is removed by conventional etching technique. This step exposes the substrate. The exposed substrate regions are doped by conventional technique such as ion implantation to form the emitter. The photo-resist is stripped. The emitter insulator is formed, such as an oxide, on the exposed substrate by thermal oxidation, or by a rapid-thermal oxidation technique to reduce the thermal budget. The step also forms oxide 202 on the exposed substrate and the oxide thus formed is self-aligned to the emitter 13. Note, the emitter insulator 202 is formed to have a width wider than that of the emitter 13. The wider structure of the oxide 202 can be achieved by forming the emitter 13 in a later stage of the manufacturing steps, such as formed after the contact holes formation described and illustrated in an alternate embodiment in connection with FIG. 23 and FIG. 23A.

FIG. 23 and FIG. 23A depict semiconductor materials and steps for an alternate method of arranging string arrays and PCM memories in embodiments of the present specification. The manufacturing method starts with a conductive region of the first conductivity type (p-type). The conductive region functions as a collector electrode and can be formed in a well region or a semiconductor substrate of identical conductivity.

In connection with FIG. 23 and FIG. 23A, an isolation such as Shallow Trench Isolation (STI) 110 is arranged in the logic area, that is, non-memory area 157, by conventional STI formation techniques followed by forming a thin oxide layer 24 atop of the substrate. This step forms first STI regions 110. A logic well 210 region 210 is arranged in non-memory area 157 by first applying photo-resist followed by an ion implantation technique to dope the well region 210 with at least one or more types of impurities. A first diffusion (base diffusion 9) of a second type conductivity (n-type) is arranged in the substrate of memory area 156 by using ion implantation techniques. A photo-resist and masking step is applied prior to the ion implant to block ions from implanted in the non-memory area 157.

In connection with FIG. 23 and FIG. 23A, the thin oxide layer in the memory area 156 is optionally removed by a conventional oxide etch. Prior to the etch, an etching mask using photo-resist and masking step is applied to cover the non-memory area 157 and to expose the memory area 156. The photo-resist forming the base diffusion can be employed instead as the etching mask. The etching mask is stripped after the etch. The thin oxide layer in the memory area 156 can be optionally used as an emitter insulator 202. In the case that the thin oxide is removed, the emitter insulator in the memory area 156 can be reformed by, for example, a thermal oxidation technique. A typical thickness for the emitter insulator 202 ranges from about 5 nanometer (nm) to about 50 nm. The step is followed by forming photo-resist lines at minimum feature size F along a first direction (Y-axis direction) in the memory area 156. This step exposes the emitter insulator 202 uncovered by the photo-resist mask lines. The exposed emitter insulator is removed by conventional etching technique. This step exposes the substrate. The photo-resist is stripped.

FIG. 24, FIG. 24A and FIG. 24B depict semiconductor materials and steps for further arranging string arrays and PCM memories in embodiments of the present specification. A base conductor 30 is arranged over the structure of FIG. 23 and FIG. 23A. The base conductor 30 is formed with a planar surface and is formed, for example, by depositing a polysilicon layer having impurity of the second conductivity type. The impurity in the base conductor 30 can be introduced by in-situ techniques. Alternately, the impurity can be introduced by ion implant at the stage after forming the base conductor 30 or more desirably in a latter stage. One such alternate embodiment is to dope the base conductor 30 using the same implant that forms the source 168-1 and drain 168-2 diffusions of the field-effect transistor 99 (see FIG. 26A and FIG. 27A). The doping concentration of the base conductor 30 typically ranges from about $1 \times 10^{18}$ to $1 \times 10^{21}$ atoms/cm$^3$.

In connection with FIG. 24, FIG. 24A and FIG. 24B, a thick nitride layer 37 is arranged over the base conductor 30. The thickness of the nitride typically ranges from about 20 nm to about 80 nm. A photo-resist followed by a masking step is applied to form a plurality of photo-resist line traces 38 along the second direction (X-axis direction) in the memory area 156. Each line trace 38 is separated from an adjacent trace by a second trench 40. This step forms an etching mask for the subsequent etching steps. The non-memory area 157 is covered by the etching mask. The thick nitride 38 not covered by the etching mask is removed by applying a nitride etching step followed by another etching step to remove the base conductor 30 in the second trenches 40. This step exposes the emitter insulators 202 in the second trenches 40. The exposed emitter insulators 202 are removed by conventional etching techniques to expose the substrate. The step is followed by applying an etching step to remove a portion of the substrate to deepen the second trench to form a plurality of emitter insulators, each is substantially in a rectangular or square shape in its top view. The etch also forms sidewalls and a bottom of each trench within the substrate. The final depth of the second trench 40 is preferred at a depth deeper than the depth of the base diffusion 9. The step forms a plurality of base diffusions and base conductor 3 lines both oriented along the second direction (X-axis direction). The sidewall and the bottom of the second trench are exposed to the air.

FIG. 25, FIG. 25A and FIG. 25B depict semiconductor materials and steps for further arranging string arrays and PCM memories. In connection with FIG. 25, FIG. 25A and FIG. 25B, the photo-resist line traces and etching mask of FIG. 24, FIG. 24A and FIG. 24B are removed. An oxide layer is arranged on the sidewalls and the bottom of each of the second trenches 40 of FIG. 24, FIG. 24A and FIG. 24B. This can be done by conventional thermal oxidation, in-situ steam grown oxidation (ISSG), rapid-thermal oxidation (RTO), or any other oxidation technique. Generally, it is desired to employ techniques that require a low thermal budget. The trenches are filled by a gap-filling dielectric (for example, HDP oxide) 41. The gap-filling dielectric 41 is polished off by using a chemical-mechanical polishing (CMP) technique. The CMP process uses the thick nitride 37 as a polishing stopper. An optional etch-back technique can be employed to clear any residue of the gap-filling dielectric on the thick nitride surface. The step forms a second Shallow-Trench-Isolation (STI) regions 41 oriented along the second direction (X-axis direction) in the structure.

FIG. 26, FIG. 26A and FIG. 26B depict semiconductor materials and steps for further arranging string arrays and PCM memories. In connection with FIG. 26, FIG. 26A and FIG. 26B, the thick nitride 37 of FIG. 25, FIG. 25A and FIG. 25B is removed. This can be done, for example, by employing hot phosphoric acid to etch the nitride 37. A photo-resist followed by a masking step is arranged to protect memory area 156. The step exposes base conductor 30 in the non-memory area 157. The exposed base conductor 30 in the non-memory area 157 is etched followed by stripping the photo-resist.

In connection with FIG. 26, FIG. 26A and FIG. 26B, a gate insulator 160 is arranged for the logic field-effect transistor 99 being formed in the non-memory area 157 by using thermal oxidation technique. This step also forms oxide 137 on base conductor 30 in memory area 156. Gate 163 is formed for the of the logic field-effect transistor 99. This can be done, for example, by first depositing a polysilicon layer followed by applying photo-resist, masking step and a RIE etch. In connection with FIG. 26, FIG. 26A and FIG. 26B, gate 163 sidewall spacers 165 are arranged along the sidewalls of the gate 163. As an example, the spacers 165 can be formed by first depositing a thin oxide layer 156 such as TEOS, followed by depositing a spacer nitride layer. An RIE etching on the spacer nitride layer is next performed to form the spacers 165. Source 168-1 and drain 168-2 diffusions are formed in the logic field-effect transistor 99. This can be done by applying photo-resist and masking steps followed by ion implanting impurity in the non-memory area 157. In an alternate embodiment, the base conductor 30 can be doped by sharing the implant forming the source 168-1/drain 168-2 diffusions.

FIG. 27, FIG. 27A and FIG. 27B depict semiconductor materials and steps for further arranging string arrays and PCM memories. In connection with FIG. 27, FIG. 27A and FIG. 27B, the TEOS oxide 156 and the gate insulator 160 are removed by an oxide etch to expose the base conductor 30 in the memory area 156. This step also exposes the source 168-1/drain 168-2 diffusions and the gate 163 of field-effect transistors in the non-memory area 157. A self-aligned silicide (Salicide) 137 is arranged over the exposed base conductor 30, gate 163 and diffusions of field-effect transistor 99. An optional oxynitride layer 139 is arranged with thickness ranging from about 10 nm to about 50 nm over the structure, followed by depositing a first inter-layer-dielectric (ILD1) 7-1.

In connection with FIG. 27, FIG. 27A and FIG. 27B, a photo-resist and masking step are arranged to define a first type of contact opening 44. Such contact openings 44 are formed over the emitter insulators 202. This step exposes the ILD1 in the contact mask opening area. The exposed ILD1 7-2 is etched until the oxynitride 139 is observed, followed by etching the exposed oxynitride 139 to observe salicide 137 of the base conductor 30. The step is followed by etching the exposed salicide 137 and the base conductor 30 to expose the emitter insulator 202. The exposed emitter insulator 202 is etched until observing the substrate to form a plurality of contact holes 44. Each contact hole 44 can be centered at one of the emitter insulators 202, as illustrated in FIG. 19B, or can be located off the center. For example, the contacts can be shifted along the horizontal direction or along the vertical direction as illustrated in FIG. 27. The photo-resist and the etching mask are stripped.

FIG. 28, FIG. 28A and FIG. 28B depict semiconductor materials and steps for further arranging string arrays and PCM memories. In FIG. 28, FIG. 28A and FIG. 28B, the process is continued from the structure shown in FIG. 27, FIG. 27A and FIG. 27B. Contact sidewall spacers 32 of an insulator (for example, oxide, nitride, oxynitride etc) along sidewalls of each contact hole by using conventional sidewall spacer formation technique. The sidewall spacers 32 typically have a width at the bottom of the contact holes in the range of about 5 nm to about 20 nm. The step also exposes the substrate in a bottom opening of the contact hole. The exposed substrate is doped, for example, by ion implantation techniques followed by thermal treatment, for example, rapid-thermal-anneal (RTA) to anneal the implant damage. An optional salicide is arranged on the exposed substrate using conventional silicidation techniques. Such salicide (not shown) is formed at the bottom of each contact 20 and self-aligned to the emitter 13. Such silicide step can form the structure of the embodiment in FIG. 18B. The step forms emitters 13 in the substrate. The emitters 13 thus formed are self-aligned to the contact 20. A metal (for example, tungsten) is used to fill the contact holes (by employing, for example, LPCVD technique). The step forms contacts 20 for each of the emitters 13. The structure thus formed can be further processed to integrate PCRAMs with one terminal of each PCRAM connected to one of the contacts 20 and connected to the emitter conductor (not shown).

In FIG. 28, FIG. 28A and FIG. 28B, the holes 44 and the emitter contacts 20 are off set in the Y-axis direction from the center of the array spacing established by the base conductors 30. Similarly, although not shown, the holes 44 and the emitter contacts 20 can also be off set in the X-axis direction from the center of the array spacing established by the emitters 13. In general, the holes 44 and the emitter contacts 20 can be off set in both the X-axis and the Y-axis directions, that is, off set in either or both directions from the center of the array spacing established by the string arrays and the emitters.

Figures 29, 29A, 29B:
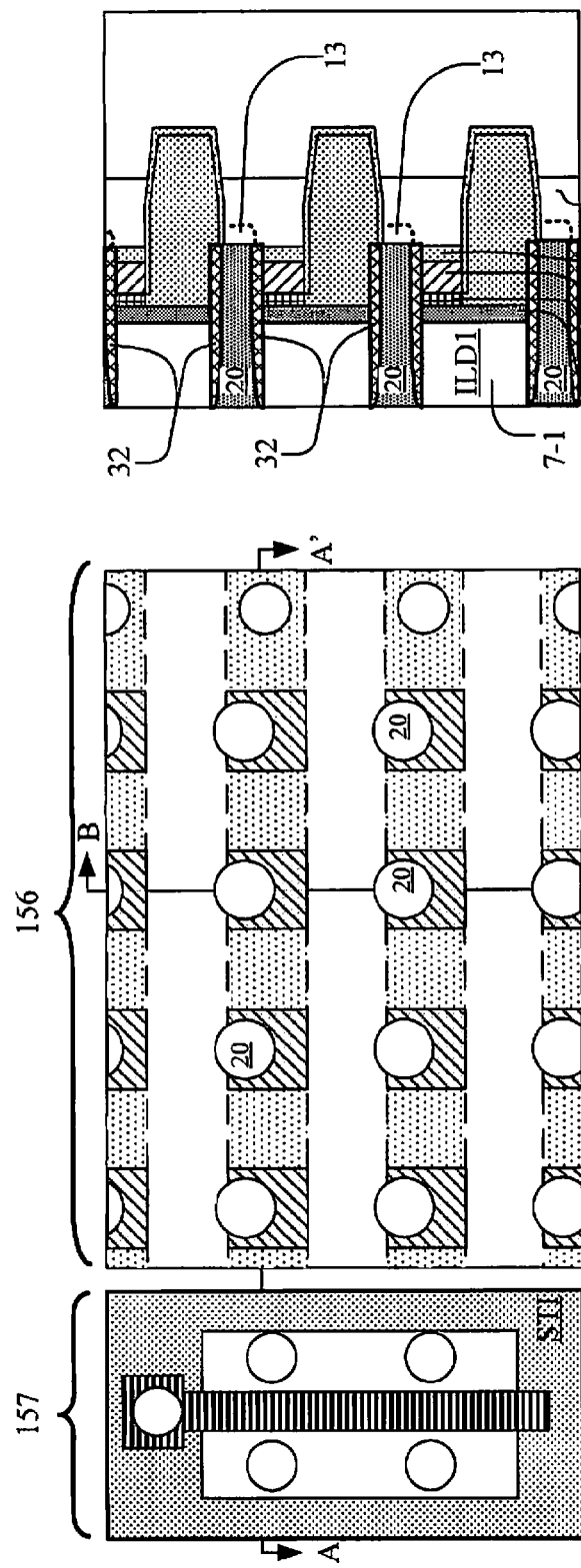
FIG. 29, FIG. 29A and FIG. 29B depict semiconductor materials and steps for further arranging string arrays and PCM memories in embodiments of the present specification.

FIG. 29, FIG. 29A and FIG. 29B depict semiconductor materials and steps for further arranging string arrays and PCM memories. In FIG. 29, FIG. 29A and FIG. 29B, the process is continued from the structure shown in FIG. 28, FIG. 28A and FIG. 28B to result in structures shown in FIG. 20 and FIG. 21. The processing continues by depositing a second inter-layer-dielectric 7-2 (ILD2) (not shown, see FIG. 21). A photo-resist and masking step is applied to define a second type of contact holes in each of the base conductor 30 lines. Such contact holes are also formed in the source 168-1 and drain 168-2 diffusions, the gate 163 area of field-effect transistors, and in other memory area 156, for example, PCM strapping area (not shown). This step exposes the ILD2 in the contact mask opening area. The exposed ILD2 is etched until the ILD1 is observed. The etch is continued to remove the exposed ILD1 until oxynitride is observed. The etch is followed by etching the exposed oxynitride to observe salicide of the base conductor 3, salicides of diffusions and gate 163 of field-effect transistors.

In connection with FIG. 29, FIG. 29A and FIG. 29B, the photo-resist and the etching mask are stripped followed by forming metal (for example, tungsten) to fill the contact holes. The step forms general contacts in both memory-area 156 and non-memory area 157. The structure can be further processed to form metal layers to integrate PCRAMs with one terminal of the PCRAM connected to one of the emitter conductors and the other terminal connected to a word line metal (for example, M1 or M2) to result structures shown in FIG. 20 and FIG. 21.

The process steps illustrated herein is for a method arranging various regions to form the embodiment provided in FIG. 18. The illustration can be readily modified to form other embodiments provided in the present specification. For example, the emitter insulator in the memory area 156 and the steps forming such insulator can be skipped to form the embodiment provided in FIG. 18A.

Although the foregoing method is illustrated in a two-polysilicon layer method (that is, one poly for the base conductor 30 and the other poly layer for the gate 163 of field-effect transistor 99), the method of the present specification can also be simplified to provide a single-poly-based process flow, wherein the base conductor 30 is shared with the gate 163 of logic field-effect transistor 9. This can be done by following steps:

Starting from the structure shown in FIG. 9, FIG. 9A, and FIG. 9B to form gate 163 of field-effect transistors in the non-memory area 156. This can be done by applying photo-resist and a masking step to define patterns for the gate 163 of field-effect transistors. This step exposes a portion of the thick nitride in the non-memory area 157. The photo-resist patterns thus defined form an etching mask, which protects the memory area 156.

Remove the exposed thick nitride followed by removing the underlying base conductor 3 using conventional RIE etch until the thin oxide in the non-memory area 157 is observed. This step forms gate 163 of field-effect transistors using the base conductor 3 in the non-memory area 157. The memory area 156 including base conductor 3 and emitter insulator are protected by the etching mask, and the etch has no effect in these regions.

The resulted structures are further processed following similar steps as described in connection with FIG. 26 through FIG. 29 to complete the manufacturing process.

What is claimed is:

1. A semiconductor device comprising:
    a string array including T bipolar junction transistors, where T is an integer and wherein the string array comprises:
    a common collector region for the T bipolar junction transistors;
    a common base region for the T bipolar junction transistors; and
    a plurality of emitters, one emitter for each of the T bipolar junction transistors, wherein the plurality of emitters includes emitter contacts;
    B base contacts for the T bipolar junction transistors, the B base contacts electrically coupling the common base region, where B is an integer and is less than T;
    a logic region including one or more logic transistors; and
    an isolation region for isolating the logic transistors,
    wherein the emitter contacts are offset from a center of an array spacing established by the string array and the plurality of emitters.

2. The semiconductor device of claim 1, wherein the logic transistors are FETs including a source, a drain and a gate.

3. The semiconductor device of claim 1, wherein the logic transistors are FETs including:
    a source diffusion region and a drain diffusion region separated by a channel and located in a logic well;
    a gate insulator juxtaposed the channel; and
    a gate juxtaposed the gate insulator and the channel.

4. The semiconductor device of claim 1, wherein the logic transistors are FETs and comprise:
    a first diffusion region and a second diffusion region separated by a channel and located in a logic well;
    a gate insulator juxtaposed the channel;
    a gate juxtaposed the gate insulator and the channel;
    a first contact electrically coupling the first diffusion region;
    a second contact electrically coupling the second diffusion region; and
    a gate contact electrically coupling the gate.

5. The semiconductor device of claim 4, wherein:
    the first contact includes a first salicide region in contact with the first diffusion region;
    the second contact includes a second salicide region in contact with the second diffusion region; and
    the gate includes a gate salicide region.

6. The semiconductor device of claim 5, wherein:
    the first contact includes a first additional contact extending to a first metallization region; and
    the second contact includes a second additional contact extending to the first metallization region.

7. The semiconductor device of claim 1, wherein each of the plurality of emitters is juxtaposed and electrically coupled to a respective one of the emitter contacts.

8. The semiconductor device of claim 1, wherein each of the emitter contacts is juxtaposed a respective one of the plurality of emitters, electrically coupled to a respective one of the plurality of emitters, and electrically couples a memory cell.

9. The semiconductor device of claim 8, wherein an emitter conductor electrically couples the memory cell.

10. The semiconductor device of claim 8, further including a general contact extending from the memory cell to a metallization region.

11. The semiconductor device of claim 1, wherein each of the plurality of emitters is juxtaposed and electrically coupled to an emitter conductor.

12. The semiconductor device of claim 11, wherein each of the emitter conductors includes an emitter poly region and a poly silicide region.

13. The semiconductor device of claim 1, wherein each of the plurality of emitters electrically couples one of the emitter contacts.

14. The semiconductor device of claim 13, wherein:
    each of the emitter contacts is within respective side wall spacers; and
    junction edges of the plurality of emitters are aligned with the side wall spacers.

15. The semiconductor device of claim 13, wherein the emitter contacts extend through respective emitter insulators.

16. The semiconductor device of claim 13, wherein the emitter contacts electrically couple the plurality of emitters via emitter silicide regions.

17. The semiconductor device of claim 1, wherein the isolation region extends around the logic region forming a logic well for the logic transistors.

18. The semiconductor device of claim 1, wherein the bipolar junction transistors are spaced apart by a cell pitch.

19. The semiconductor device of claim 1, further including a plurality of memory cells, each memory cell electrically coupling a corresponding one of the plurality of emitters.

20. The semiconductor device of claim 19, wherein the bipolar junction transistors and the memory cells are spaced apart by a cell pitch.

21. The semiconductor device of claim 1, wherein:
   each of the plurality of emitters and the common collector region are of one conductivity type, and the common base region is of another conductivity type;
   the string array, for each of the plurality of emitters, comprises:
      side wall insulators located on sidewalls of the emitter contacts; and
      a base salicide region juxtaposed the common base region and located between respective ones of the emitter contacts; and
   the semiconductor device further comprises an inter-layer dielectric that is juxtaposed the base salicide regions, is disposed about the side wall insulators, is disposed about the base contacts, and is juxtaposed the one or more logic transistors.

22. The semiconductor device of claim 1, wherein the string array, for each of the plurality of emitters, comprises:
   side wall insulators located on sidewalls of the emitter contacts; and
   a base conductor region juxtaposed a base diffusion region and disposed about the side wall insulators.

23. The semiconductor device of claim 22, wherein the base conductor regions comprise:
   a base poly region juxtaposed one of the base diffusion regions; and
   a base salicide region juxtaposed the base poly region.

24. The semiconductor device of claim 23, wherein the base poly regions include a surface, and the base salicide regions cover the surface.

25. The semiconductor device of claim 24, wherein the base poly regions include a top surface and a side wall surface, and the base salicide regions cover the top surface and the side wall surface.

26. The semiconductor device of claim 22, further comprising an inter-layer dielectric juxtaposed the base conductor regions, disposed about the side wall insulators, and disposed about the base contacts.

27. The semiconductor device of claim 1, further comprising:
   a plurality of memory cells, each memory cell electrically coupling a corresponding one of the plurality of emitters; and
   one or more word lines electrically coupling the memory cells.

28. The semiconductor device of claim 1, wherein the B base contacts electrically couple device lines.

29. The semiconductor device of claim 28, wherein one of the B base contacts (i) extends to one of the device lines through a first additional contact and (ii) extends to another one of the device lines through a second additional contact.

30. The semiconductor device of claim 1, wherein an emitter conductor is arranged between one of the emitter contacts and one of the plurality of emitters.

31. A semiconductor device comprising:
   a substrate;
   a plurality of string arrays arranged on the substrate, each string array including a plurality of bipolar junction transistors, wherein the bipolar junction transistors comprise:
      a common collector region;
      a common base region;
      a plurality of emitters, one emitter for each of the bipolar junction transistors, wherein the plurality of emitters includes emitter contacts; and
      a single base contact that electrically couples the common base region;
   array isolation regions extending into the substrate and separating the plurality of string arrays;
   a logic region arranged on the substrate and including one or more logic transistors; and
   a logic isolation region extending into the substrate for isolating the logic transistors,
   wherein at least one of the emitter contacts from each string array is offset from a center of an array spacing established by the plurality of string arrays and the plurality of emitters from the string array.

32. The semiconductor device of claim 31, wherein:
   the emitter contacts electrically couple the plurality of emitters; and
   each of the emitter contacts is located between a first array isolation region and a second array isolation region.

33. The semiconductor device of claim 32, wherein one of the emitter contacts is closer to the first array isolation region than the second array isolation region.

34. The semiconductor device of claim 31, wherein the plurality of string arrays comprises:
   a first string array comprising:
      a first common base region for first bipolar junction transistors;
      a first plurality of emitters, a respective one of the first plurality of emitters for each of the first bipolar junction transistors; and
      a first single base contact for the first bipolar junction transistors electrically coupling the first common base region
   a second string array comprising:
      a second common base region for second bipolar junction transistors;
      a second plurality of emitters, a respective one of the second plurality of emitters for each of the second bipolar junction transistors; and
      a second single base contact for the second bipolar junction transistors electrically coupling the second common base region,
   wherein a first isolation region extends between the first string array and the second string array,
   wherein the first common base region is isolated from the second common base region,
   wherein the first plurality of emitters are isolated from the second plurality of emitters, and
   wherein the first single base contact is isolated from the second single base contact.

35. The semiconductor device of claim 31, further including a plurality of memory cells, each of the plurality of memory cells electrically coupling a corresponding one of the plurality of emitters.

36. A semiconductor device comprising:
a string array comprising a plurality of bipolar junction transistors, wherein the string array comprises:
- a common collector region for the plurality of bipolar junction transistors;
- a common base region for the plurality of bipolar junction transistors;
- a plurality of emitters, one emitter for each of the plurality of bipolar junction transistors; and
- a single base contact for the plurality of bipolar junction transistors, the base contact electrically coupling the common base region;

a logic region including one or more logic transistors; and
a logic isolation region for isolating the logic transistors,
wherein emitter contacts of the plurality of emitters are offset from a center of an array spacing established by the string array and the plurality of emitters.

37. The semiconductor device of claim 36, further comprising one or more memory cell string arrays including a plurality of memory cells, wherein:
- each of the one or more memory cell string arrays includes a plurality of phase-change random access memory (PCRAM) memory cells;
- each one of the plurality of PCRAM memory cells corresponds to a respective one of the plurality of emitters; and
- said plurality of bipolar junction transistors and said memory cells are arrayed at a cell pitch.

38. A method of arranging a semiconductor device, the method comprising;
arranging a string array comprising:
arranging a plurality of bipolar junction transistors;
arranging a common collector region for the bipolar junction transistors;
arranging a common base region for the bipolar junction transistors;
arranging a plurality of emitters, one emitter for each of the bipolar junction transistors, wherein the plurality of emitters comprises emitter contacts; and
arranging a single base contact for the plurality of bipolar junction transistors electrically coupling the common base region;
arranging a logic region including one or more logic transistors; and
arranging a logic isolation region for isolating the logic transistors,
wherein the emitter contacts are offset from a center of an array spacing established by the string array and the plurality of emitters.

39. The method of claim 38, wherein arranging of the plurality of bipolar junction transistors comprises spacing the plurality of bipolar junction transistors apart by a cell pitch.

40. The method of claim 38, further including arranging a plurality of memory cells, each memory cell electrically coupling a corresponding one of the plurality of bipolar junction transistors.

41. The method of claim 40, further comprising arranging memory cells,
wherein the plurality of bipolar junction transistors are spaced apart by a cell pitch.

* * * * *